United States Patent
Kim et al.

(10) Patent No.: US 7,382,018 B2
(45) Date of Patent: Jun. 3, 2008

(54) 3-DIMENSIONAL FLASH MEMORY DEVICE AND METHOD OF FABRICATING THE SAME

(75) Inventors: Sung-Min Kim, Incheon Metropolitan (KR); Eun-Jung Yun, Seoul (KR); Dong-Won Kim, Gyeonggi-do (KR); Jae-Man Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/349,287

(22) Filed: Feb. 6, 2006

(65) Prior Publication Data

US 2006/0186446 A1 Aug. 24, 2006

(30) Foreign Application Priority Data

Feb. 5, 2005 (KR) .................. 10-2005-0011008

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)

(52) U.S. Cl. .................. 257/328; 257/329; 257/330; 257/331; 257/332; 257/333; 257/334; 257/401

(58) Field of Classification Search ........ 257/328–334, 257/401
See application file for complete search history.

(56) References Cited

U.S. PATENT DOCUMENTS

| | | | | |
|---|---|---|---|---|
| 4,527,257 A | * | 7/1985 | Cricchi | 365/184 |
| 4,977,436 A | * | 12/1990 | Tsuchiya et al. | 257/302 |
| 5,283,455 A | * | 2/1994 | Inoue et al. | 257/329 |
| 5,365,097 A | * | 11/1994 | Kenney | 257/302 |
| 6,757,196 B1 | * | 6/2004 | Tsao et al. | 365/185.17 |
| 6,943,373 B2 | * | 9/2005 | Takaura et al. | 257/67 |
| 6,943,407 B2 | * | 9/2005 | Ouyang et al. | 257/329 |
| 6,995,053 B2 | * | 2/2006 | Schuele et al. | 438/192 |
| 7,238,554 B2 | * | 7/2007 | Schuele et al. | 438/149 |

(Continued)

FOREIGN PATENT DOCUMENTS

JP 06-338602 12/1994

(Continued)

OTHER PUBLICATIONS

English language abstract of Korean Publication No. 2004-0043044.

(Continued)

*Primary Examiner*—Ida M. Soward
(74) *Attorney, Agent, or Firm*—Mager Johnson & McCollom, P.C.

(57) ABSTRACT

In an embodiment, a 3-dimensional flash memory device includes: a gate extending in a vertical direction on a semiconductor substrate; a charge storing layer surrounding the gate; a silicon layer surrounding the charge storing layer; a channel region vertically formed in the silicon layer; and source/drain regions vertically formed on both sides of the channel region in the silicon layer. Integration can be improved by storing data in a 3-dimensional manner; a 2-bit operation can be performed by providing transistors on both sides of the gate.

18 Claims, 26 Drawing Sheets

U.S. PATENT DOCUMENTS

| | | | |
|---|---|---|---|
| 2002/0001913 A1* | 1/2002 | Kim | 438/400 |
| 2002/0175365 A1* | 11/2002 | Hirayama | 257/329 |
| 2003/0038318 A1* | 2/2003 | Forbes | 257/331 |
| 2006/0011972 A1* | 1/2006 | Graham et al. | 257/324 |
| 2006/0044870 A1* | 3/2006 | Bhattacharyya et al. | 365/185.08 |

FOREIGN PATENT DOCUMENTS

| | | |
|---|---|---|
| JP | 10-093083 | 4/1998 |
| KR | 2000-0044900 | 7/2000 |
| KR | 2004-0043044 | 5/2004 |

OTHER PUBLICATIONS

English language abstract of Japanese Publication No. 06-338602.

English language abstract of Japanese Publication No. 10-093083.

* cited by examiner

3-DIMENSIONAL FLASH MEMORY DEVICE AND METHOD OF FABRICATING THE SAME

CROSS-REFERENCE TO RELATED PATENT APPLICATIONS

This application claims the benefit of Korean Patent Application No. 10-2005-0011008, filed on Feb. 5, 2005, in the Korean Intellectual Property Office, the disclosure of which is incorporated herein in its entirety by reference.

BACKGROUND

1. Field of the Invention

This disclosure relates to a memory device and its method of fabrication, and more particularly, to a memory device and its method of fabrication.

2. Description of the Related Art

There are several types of conventional semiconductor memory devices. For example, read only memory (ROM) type devices are non-volatile and thus stored data are retained even when their power supply is terminated. Random access memory (RAM) devices are volatile, and thus their stored data are erased when their power supply is terminated.

A flash memory device is an example of a non-volatile memory device in which the stored data can be electrically erased or written (i.e., programmable). In practice, flash memory devices are widely used in computers and memory cards because they can be erased in a single process, and are electrically programmable. However, flash memory devices should be more highly integrated with higher capacity to adapt them in commercial memory devices. Accordingly, the area of transistors included in a memory cell array and a peripheral circuit must be reduced in flash memory devices.

SUMMARY

In one embodiment, a 3-dimensional flash memory device comprises: a gate extending in a substantially vertical direction on a semiconductor substrate; a charge storing layer surrounding the gate; a semiconductor layer such as a silicon layer surrounding the charge storing layer; a channel region substantially vertically formed in the silicon layer; and source/drain regions formed on both sides of the channel region in the silicon layer.

BRIEF DESCRIPTION OF THE DRAWINGS

The above and other features and advantages of the present invention will become more apparent by describing in detail exemplary embodiments thereof with reference to the attached drawings in which:

FIGS. 5A through 12A and FIGS. 5B through 12B are cross-sectional views along a bit line and a word line, respectively, illustrating a method of fabricating the 3-D flash memory device shown in FIG. 1 or 3;

FIGS. 13A through 20A and FIGS. 13B and 20B are cross-sectional views along a bit line and a word line, respectively, illustrating a method of fabricating the 3-D flash memory device shown in FIG. 1 or 3;

DETAILED DESCRIPTION

Figure 1:
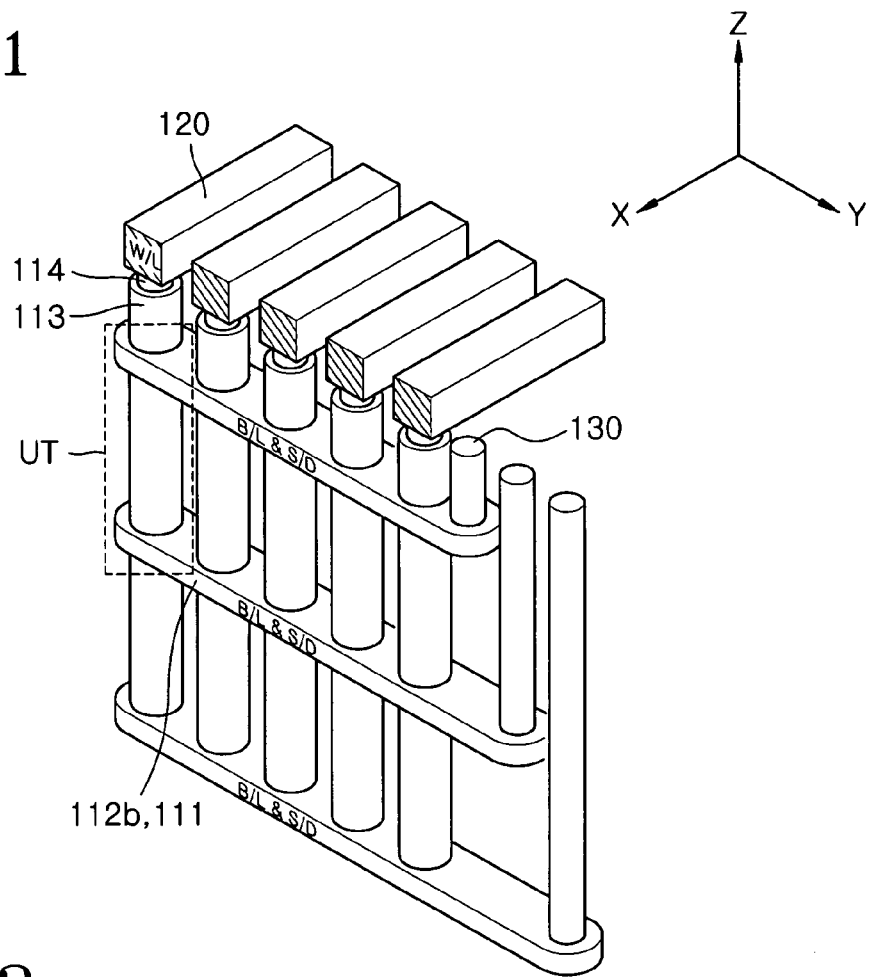
FIG. 1 is a perspective view illustrating a 3-dimensional (3-D) flash memory device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Throughout the drawings, like reference characters refer to like elements.

Figure 2:
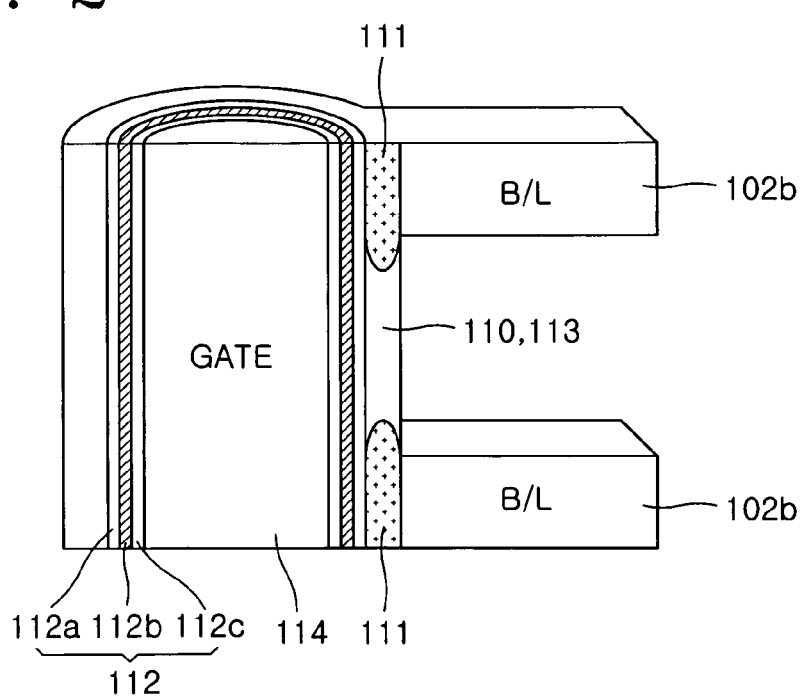
FIG. 2 is a cross-sectional view along a bit line of FIG. 2.

FIG. 1 is a perspective view of a 3-D flash memory device according to an embodiment of the present invention, and FIG. 2 is a cross-sectional view along a bit line direction of FIG. 1.

Referring to FIGS. 1 and 2, a gate 114 extending in a vertical direction (i.e., z-axis direction) is provided on a semiconductor substrate (not shown). The gate 114 is surrounded by a charge storing layer 112, which may include an oxide layer 112a, a nitride layer 112b, and another oxide layer 112c. The oxide layer 112c may be an interlayer insulation layer, the nitride layer 112b stores charges, and the oxide layer 112a may be a tunnel oxide layer. The charge storing layer 112 is surrounded by a semiconductor layer such as a silicon layer 110.

A channel region 113 is provided in the silicon layer 110. Also, source/drain (S/D) regions 111 extending in a vertical direction are disposed on both sides of the channel region 113. The source/drain regions 111 are connected to the bit lines 102b extending in a y-direction. The source/drain regions 111 may be formed by diffusing impurities included in the bit lines 102b into the silicon layer 110. The gate 114, the charge storing layer 112 surrounding the gate 114, and the source/drain 111 constitute one unit transistor UT.

As shown in FIG. 1, a word line 120 extending in an x-axis direction is connected to the gate 114. The channel region 113 disposed between the bit lines 102b may be formed in the silicon layer 110 excluding the source/drain regions. In FIG. 1, reference numeral 130 denotes a metallization layer.

The 3-D flash memory device according to the present embodiment may be a silicon-oxide-nitride-oxide-silicon (SONOS) type memory device, and can store data in a 3-dimensional manner to improve integration. In the configuration shown in FIGS. 1 and 2, data can be stored in each of the unit transistors UT and all data in the unit transistors UT connected to a single word line 120 can be deleted simultaneously.

Figure 3:
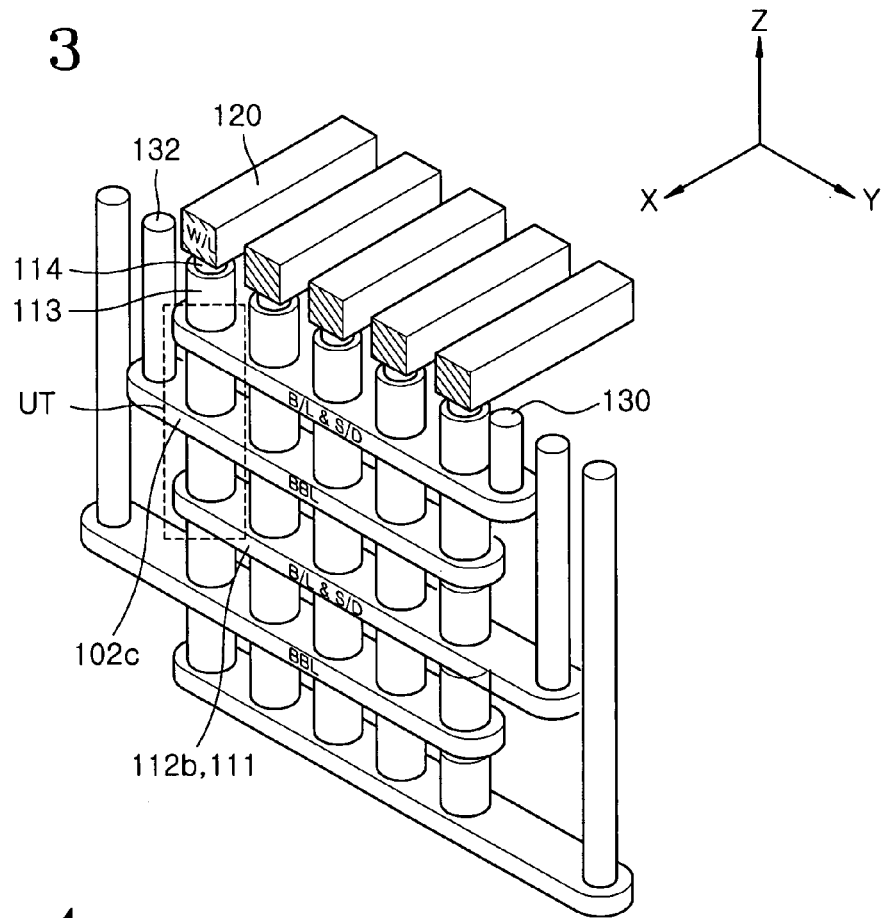
FIG. 3 is a perspective view illustrating a 3-D flash memory device according to an embodiment of the present invention.
Figure 4:
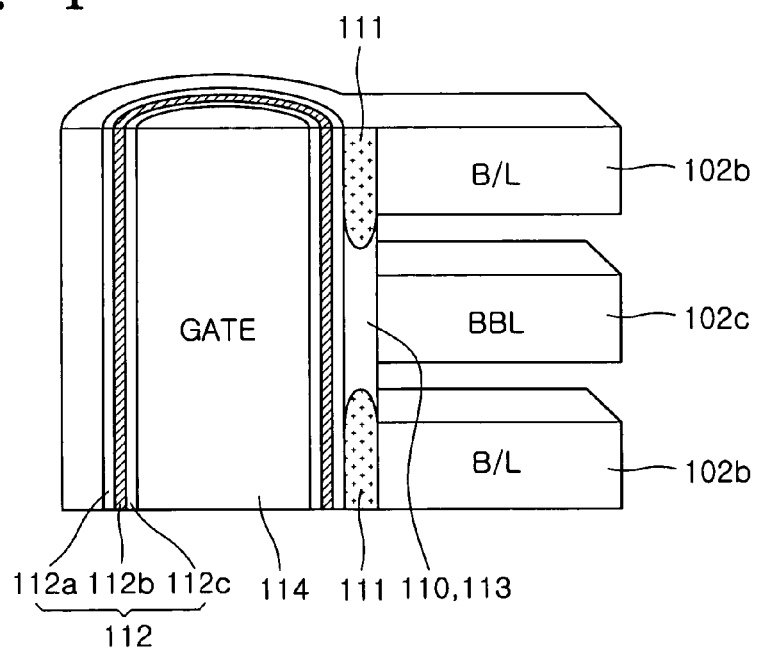
FIG. 4 is a cross-sectional view along a bit line of FIG. 3.

FIG. 3 is a perspective view of a 3-D flash memory device according to another embodiment of the present invention, and FIG. 4 is a cross-sectional view along a bit line direction of FIG. 3.

In comparison with the flash memory device shown in FIGS. 1 and 2, the flash memory device shown in FIGS. 3 and 4 additionally includes a back bias line (BBL) 102c extending in the Y-direction. The back bias line 102c is connected to the channel region 113 of the silicon layer 110. In FIG. 3, reference numeral 132 denotes a metallization layer.

The 3-D flash memory device according to the present embodiment may be a SONOS type memory device, and can store data in a 3-dimensional manner to improve integration. In the configuration shown in FIGS. 3 and 4, data can be stored and deleted in each of the unit transistors UT because a back bias can be applied to each unit transistor via the back bias line 102c.

Methods of fabricating the flash memory device according to the first and second embodiments of the present invention will now be described.

FIGS. 5a through 12a and FIGS. 5b through 12b are cross-sectional views along a bit line and a word line, respectively, illustrating a method of fabricating the 3-D flash memory device according to the first-described embodiment of the present invention.

Figure 5A:
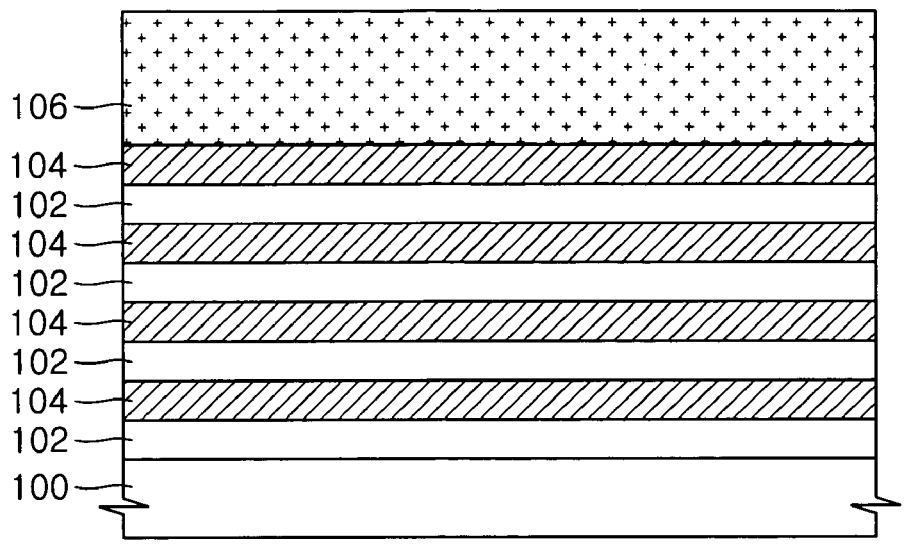
Figure 5B:
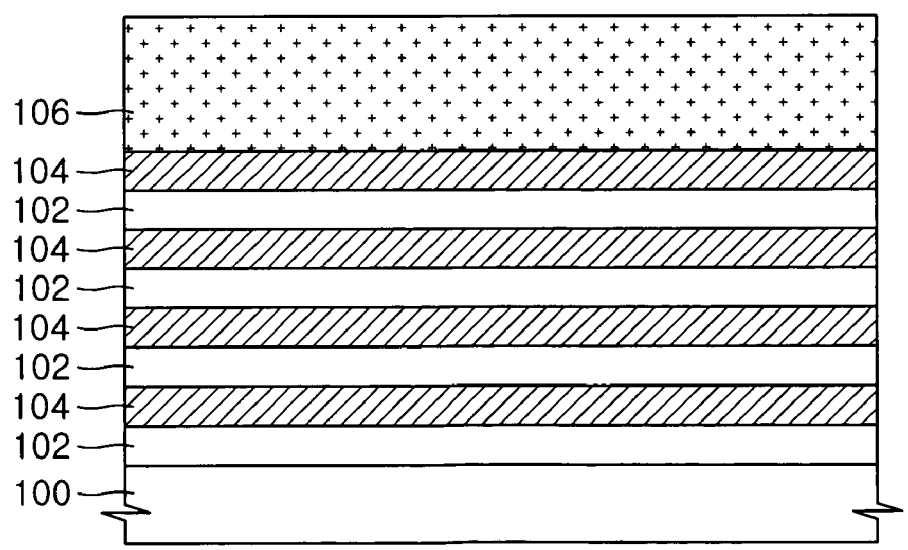

Referring to FIGS. 5A and 5B, a plurality of silicon layers 102 and a plurality of oxide layers 104 are alternately formed on a semiconductor substrate such as a silicon substrate 100. The silicon layers 102 may be doped with impurities and crystallized. The silicon layers 102 and the oxide layers 104 on the semiconductor substrate 100 may be provided by using an SOI (silicon-on-insulator) substrate prepared as shown in FIGS. 5a and 5b instead of using redundant doping procedures. When fabricating the 3-D flash memory device shown in FIGS. 3 and 4, the impurities are not doped in the silicon layer 102, which then functions as a back bias line.

Then, a first mask layer 106 is formed on the oxide layer 104. The first mask layer 106 may be a silicon nitride (SiN) layer.

Figure 6A:
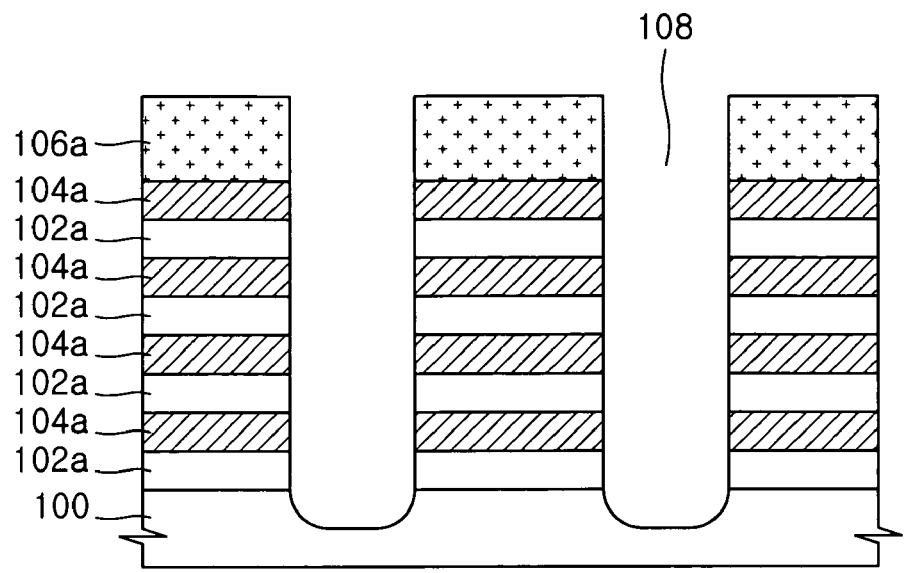
Figure 6B:
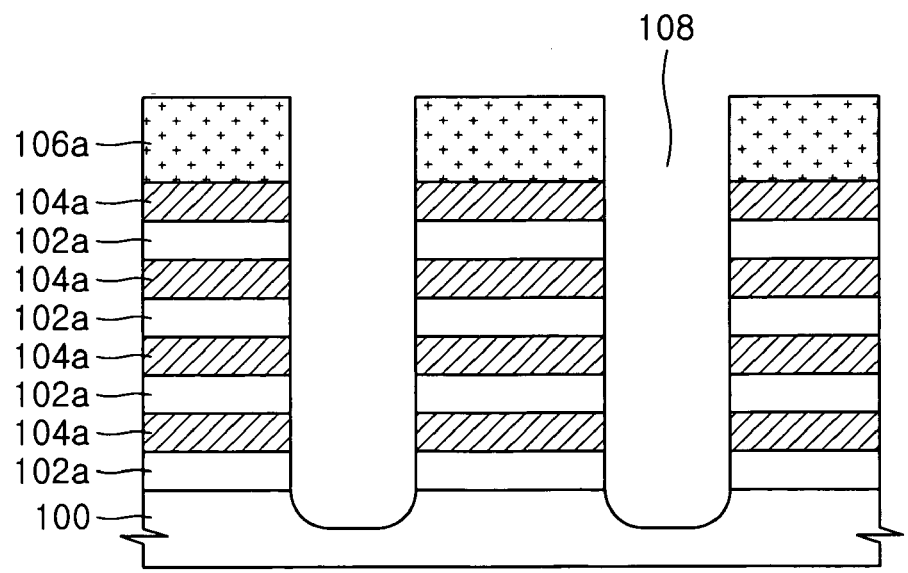

Referring to FIGS. 6A and 6B, a first mask layer pattern 106a is formed by patterning the first mask layer 106. Then, the oxide layers 104 and the silicon layers 102 are sequentially etched using the first mask layer pattern 106a as an etching mask. As a result, oxide layer patterns 104a and silicon layer patterns 102a doped with impurities are formed with a contact hole 108 for exposing the semiconductor substrate 100 extending therethrough.

Figure 7A:
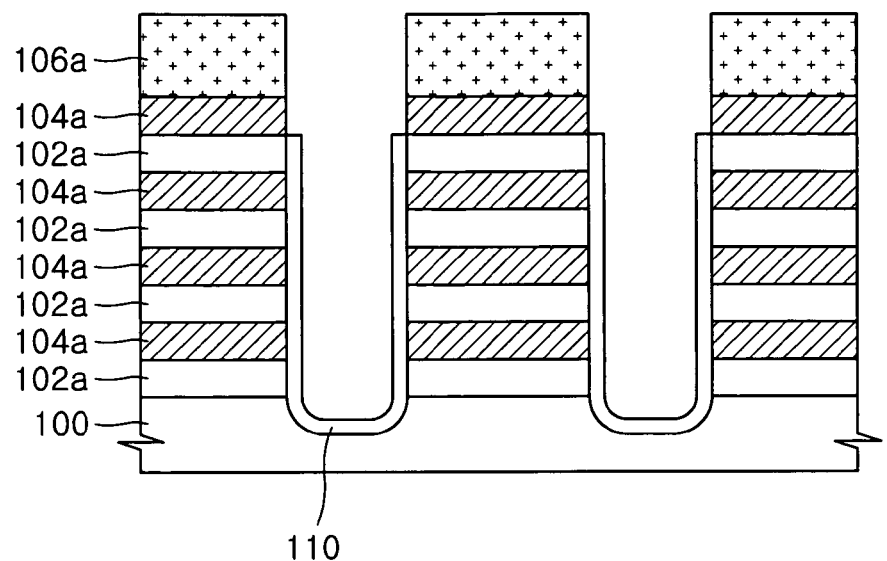
Figure 7B:
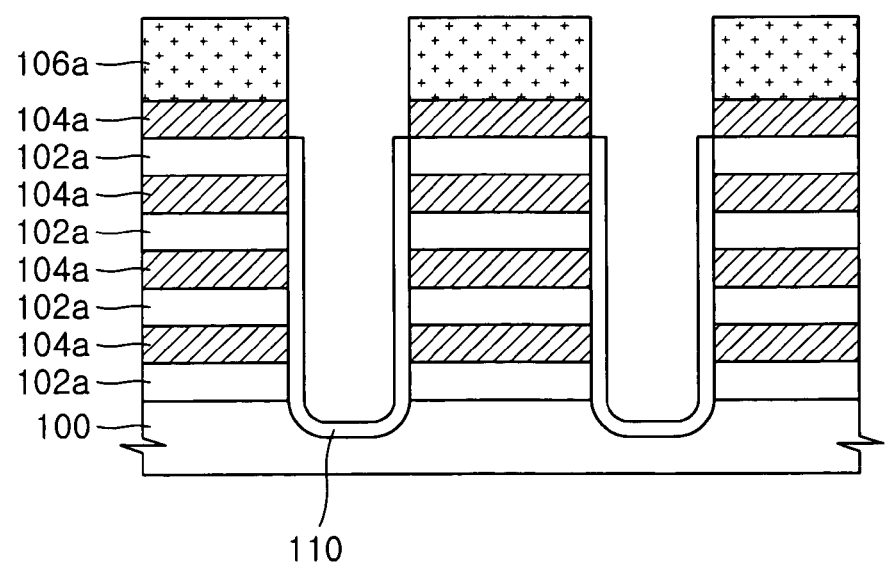

Referring to FIGS. 7A and 7B, an amorphous silicon layer is formed on the wall of the contact hole 108 and then crystallized using a solid phase epitaxial process to provide a single crystalline silicon layer 110. The solid phase epitaxial process may be performed by thermally processing (e.g., soft-baking) the amorphous silicon layer formed on the wall of the contact hole 108 at a temperature of about 600° C. for a relatively long time, e.g., about 12 hours.

Figure 8A:
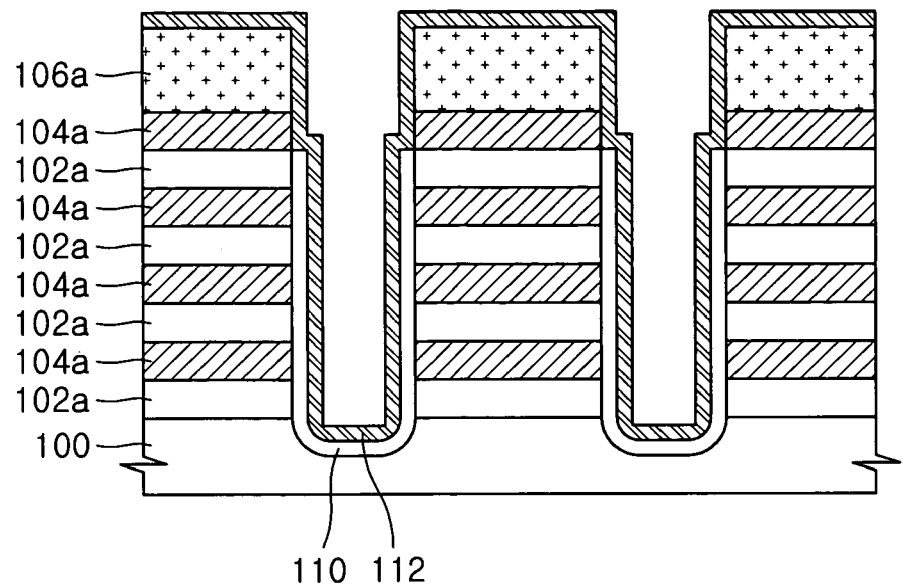
Figure 8B:
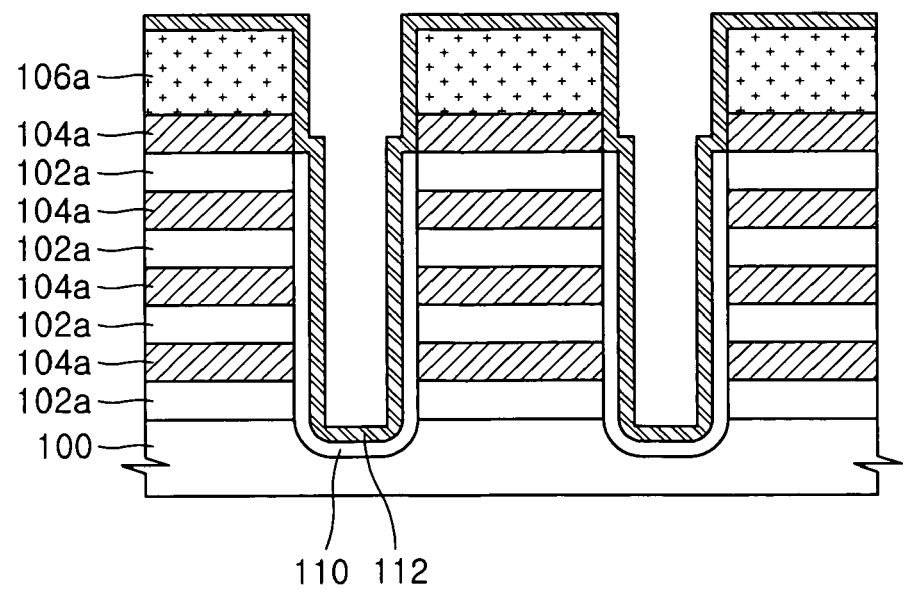

Referring to FIGS. 8A and 8B, a charge storing layer 112 is formed on the silicon layer 110 formed on the wall of the contact hole 108. The charge storing layer 112 includes an oxide layer 112a, a nitride layer 112b, and another oxide layer 112c as previously described with reference to FIGS. 2 and 4.

Figure 9A:
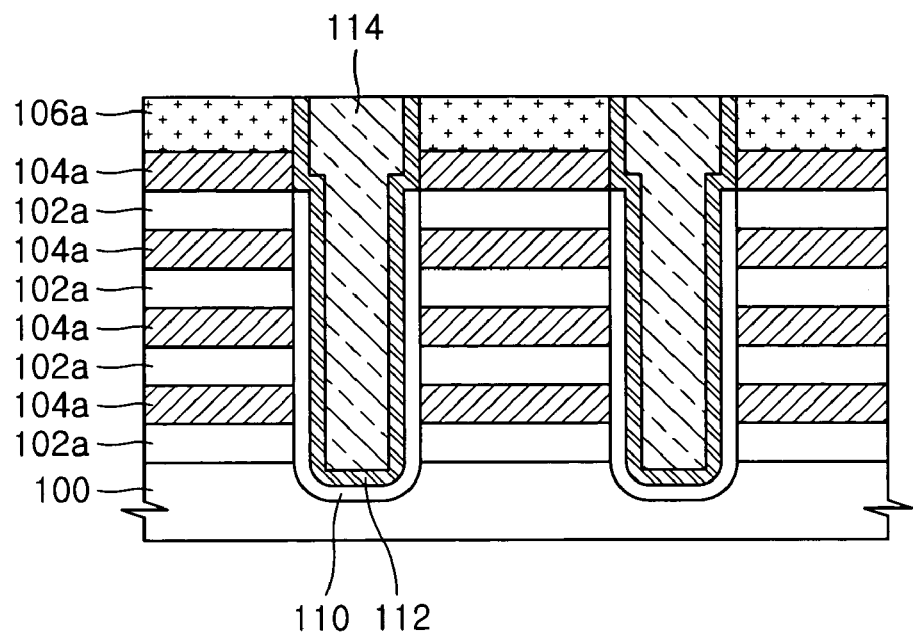
Figure 9B:
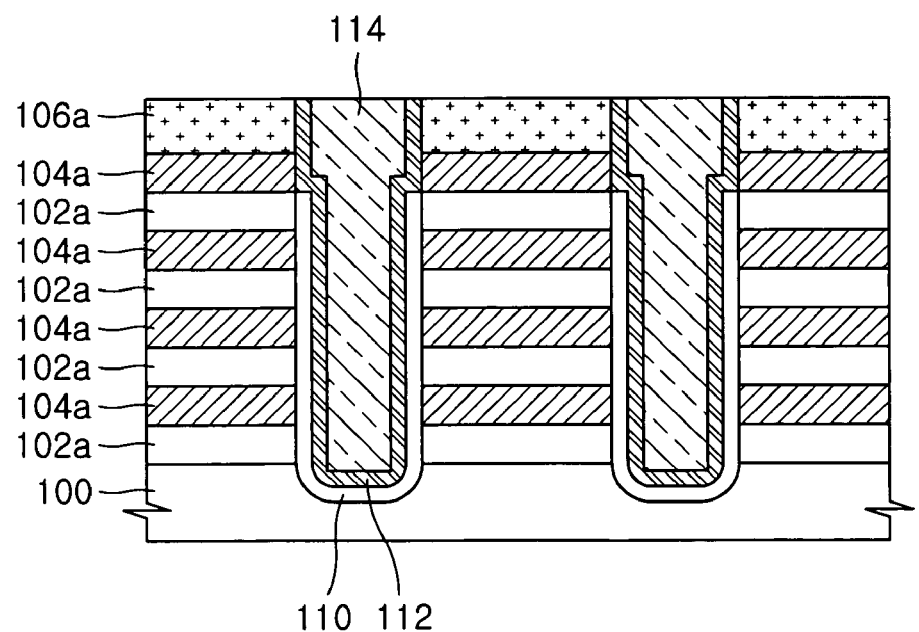

Referring to FIGS. 9A and 9B, a gate 114 is formed in the contact hole 108. The gate 114 may be provided by forming a conductive layer (e.g., a metal layer) in the contact hole 108 and then planarizing the conductive layer.

Figure 10A:
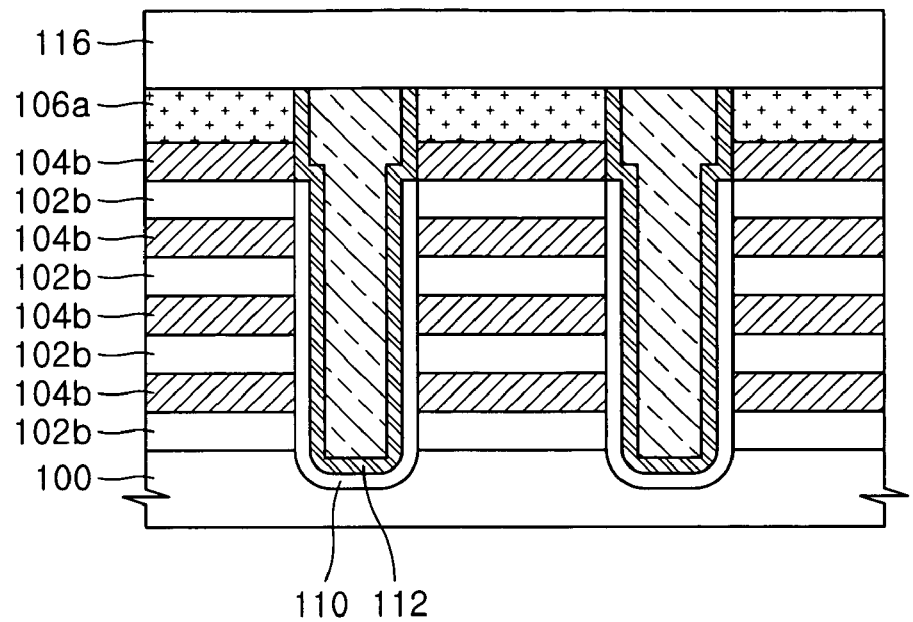
Figure 10B:
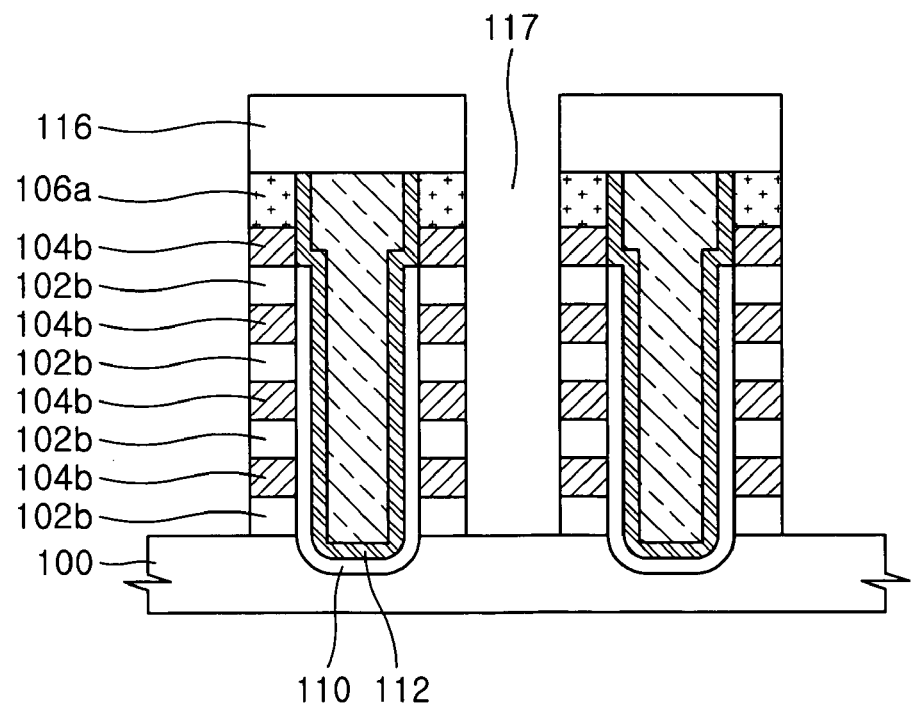

Referring to FIGS. 10A and 10B, a second mask layer pattern 116 is formed on the first mask layer pattern 106a and the gate 114. The second mask layer pattern 116 may be formed by forming a mask material layer (e.g., a silicon nitride layer) on the first mask layer pattern 106a and the gate 114 and then patterning the mask material layer using a photolithographic process.

Subsequently, the oxide layer pattern 104a and the silicon layer pattern 102 are etched, using the second mask layer pattern 116 as an etching mask, to provide a trench 117 exposing a region of the semiconductor substrate 100. As a result, the silicon layer pattern 102a is patterned to form bit lines 102b, and the oxide layer pattern 104a is patterned to form bit line insulation layers 104b for insulating the bit lines 102b.

Figure 11A:
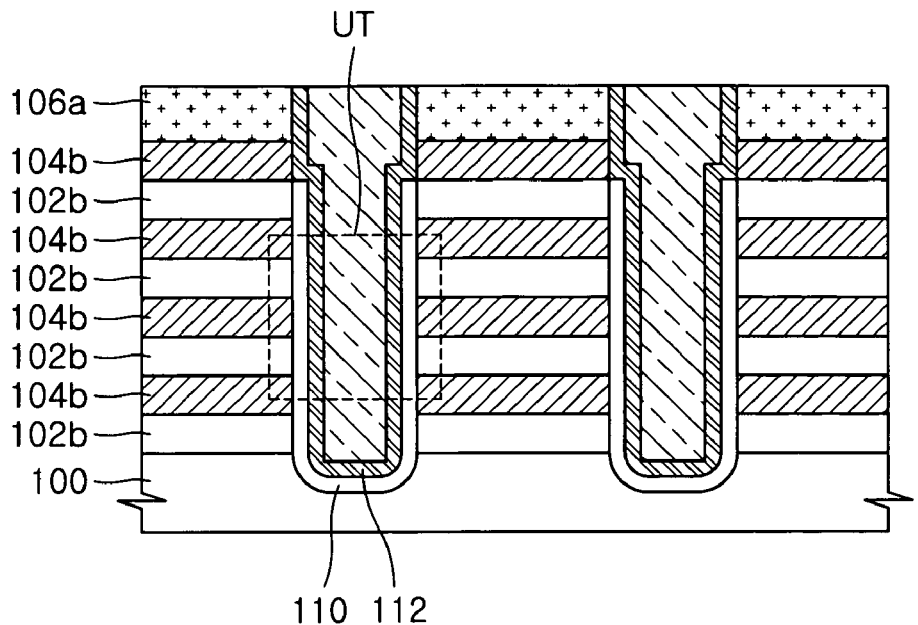
Figure 11B:
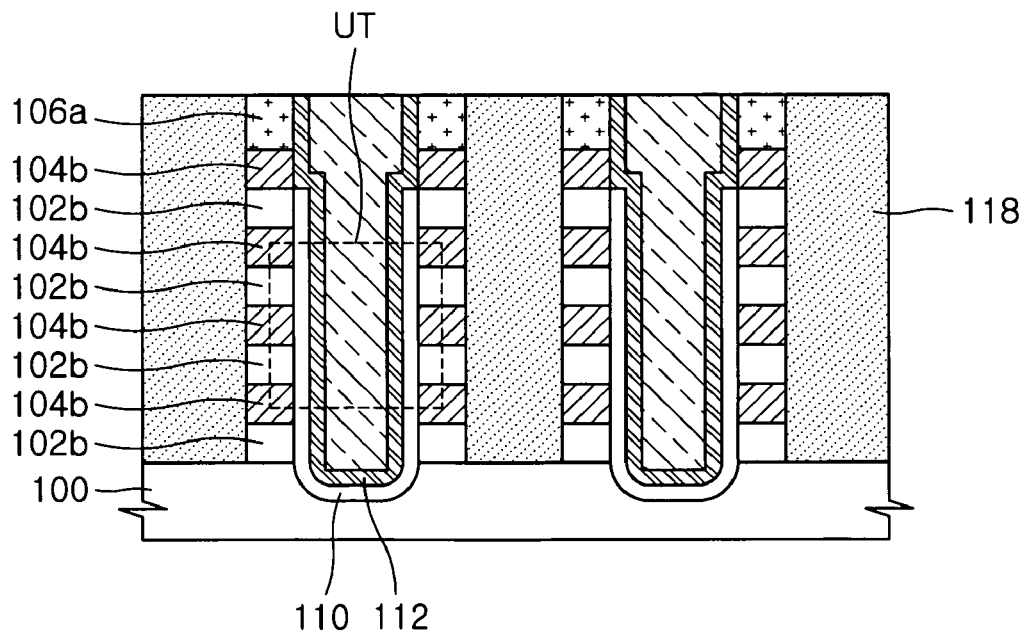

Referring to FIGS. 11A and 11B, a trench isolation layer such as a trench oxide layer 118 that buries the trench 117 is provided. Subsequently, the second mask layer pattern 116 is planarized to expose the gate 114. As a result, a unit transistor UT insulated by the trench oxide layer 118 and the bit line insulation layer 104b is provided.

The aforementioned unit transistor UT has source/drain regions isolated vertically and a channel region interposed between the source/drain regions. As described above, the source/drain regions 111 of the unit transistor UT may be formed by thermal processing (e.g., diffusing the impurities doped in the silicon layer 102a into the single crystalline silicon layer 110 during the process for forming the gate 114 or the second mask layer pattern 116) after forming the silicon layer 112.

Figure 12A:
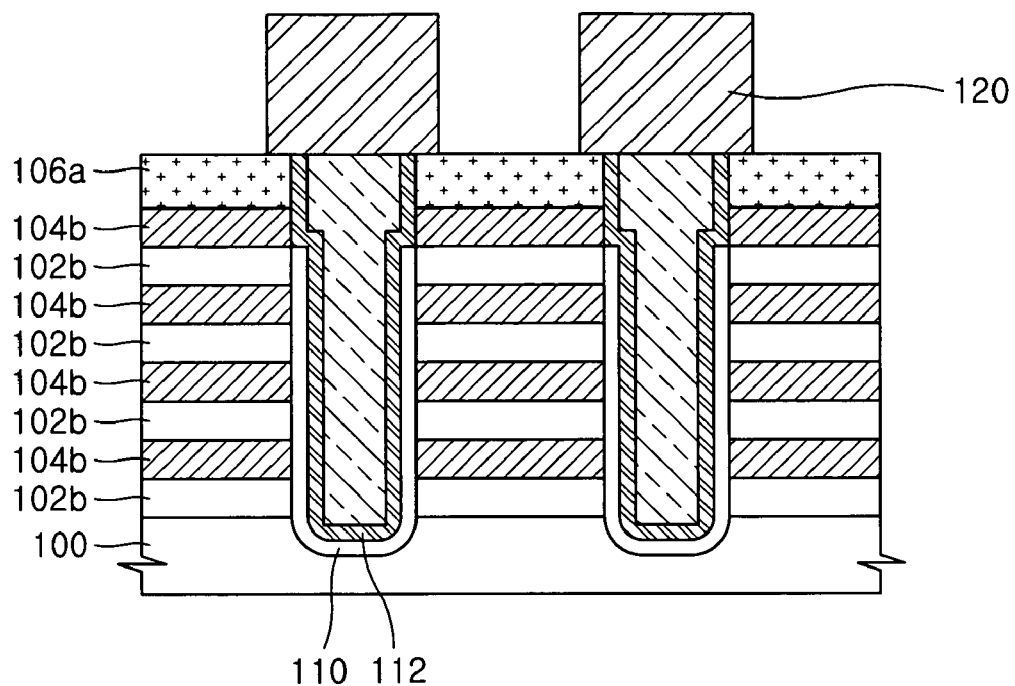
Figure 12B:
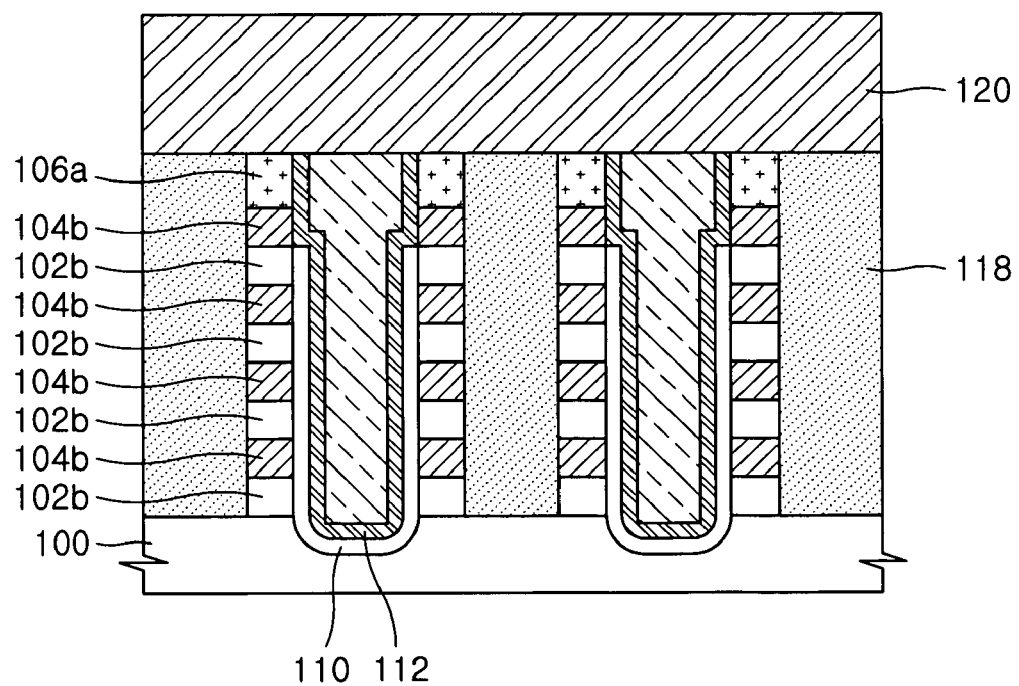

Referring to FIGS. 12A and 12B, a conductive layer such as a metal layer is formed on the gate 114 and patterned to provide a word line 120 connected to the gate 114, thereby completing the 3-D flash memory device.

FIGS. 13A through 20A and FIGS. 13B through 20B are cross-sectional views along a bit line and a word line, respectively, illustrating a method of fabricating the 3-D flash memory device according to another embodiment of the present invention.

In comparison with the method of fabricating the flash memory device according to the first embodiment, the method of fabricating the flash memory device according to the second embodiment is characterized in that the oxide layer 104 is replaced with a silicon germanium (SiGe) layer 204.

Figure 13A:
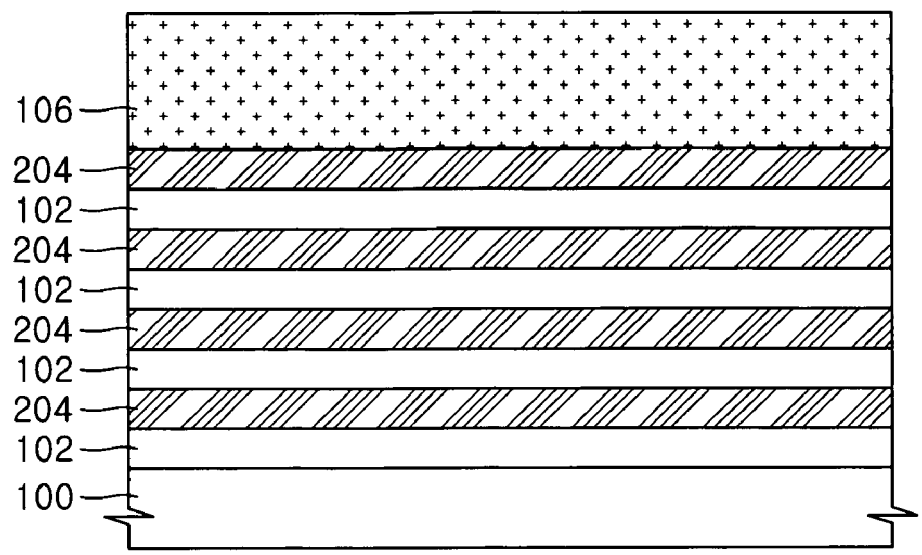
Figure 13B:
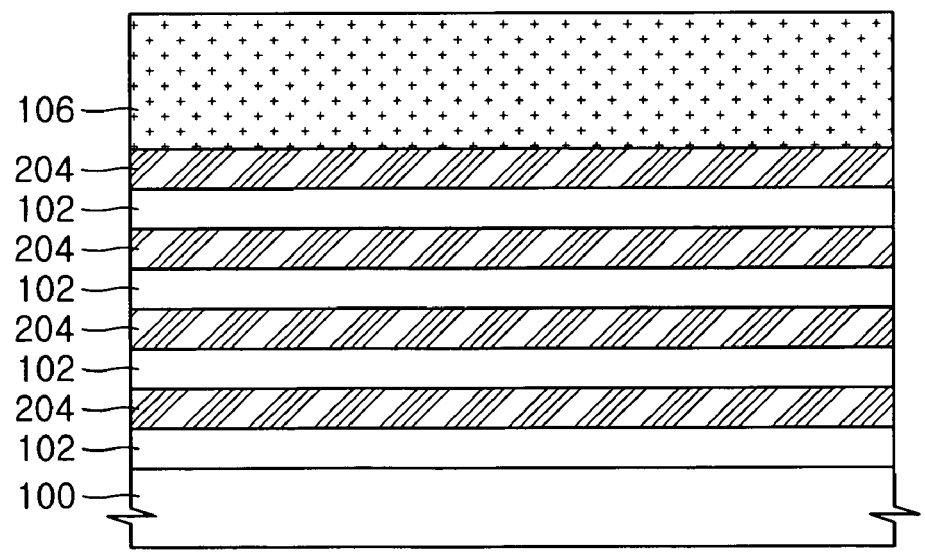

Referring to FIGS. 13A and 13B, a plurality of silicon layers 102 doped with impurities and silicon-germanium layers 204 are alternately formed on a semiconductor substrate 100. The silicon layer 102 may be crystallized.

When fabricating a 3-D flash memory device shown in FIGS. 3 and 4, impurities are not doped in the silicon layer 102, which functions as a back bias line. Then, a first mask layer 106 is formed on the uppermost silicon-germanium layer 204. The first mask layer 106 may be a silicon-nitride (SiN) layer.

Figure 14A:
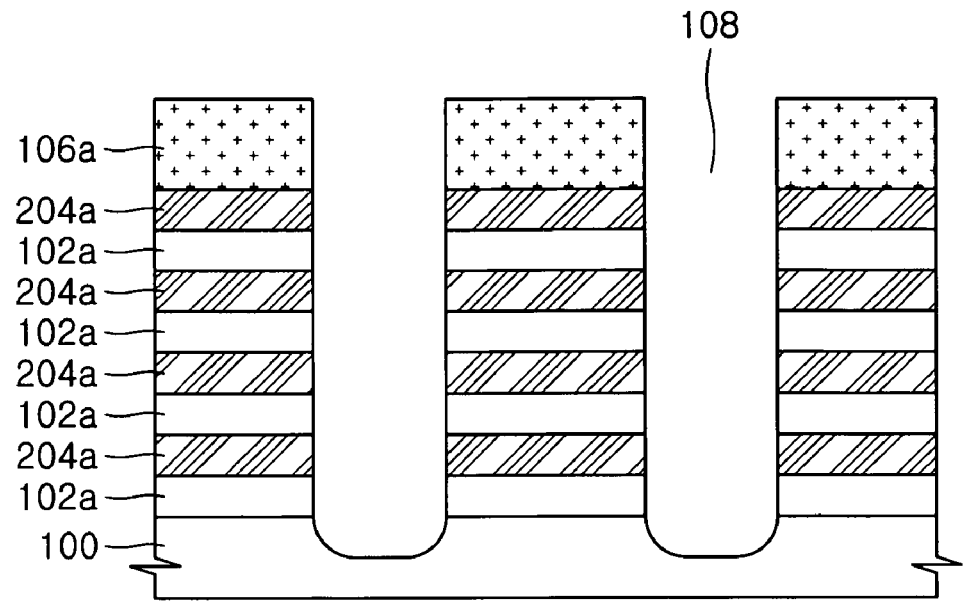
Figure 14B:
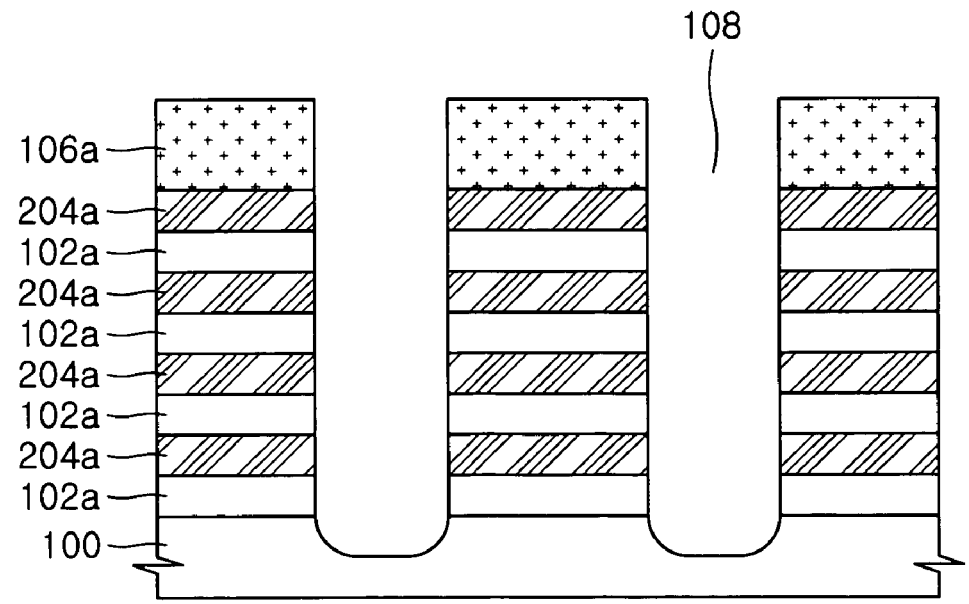

Referring to FIGS. 14A and 14B, a first mask layer pattern 106a is formed by patterning the first mask layer 106. Then, the silicon-germanium layer 204 and the silicon layer 102 are sequentially etched, using the first mask layer pattern 106a as an etching mask. As a result, a silicon-germanium layer pattern 204a and a silicon layer pattern 102a are formed with a contact hole 108 for exposing a region of the semiconductor substrate 100.

Figure 15A:
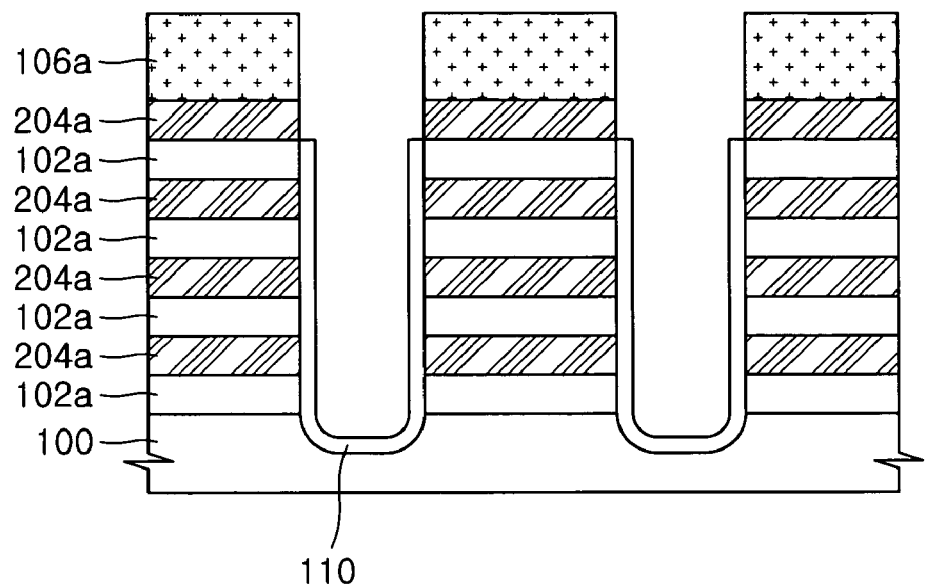
Figure 15B:
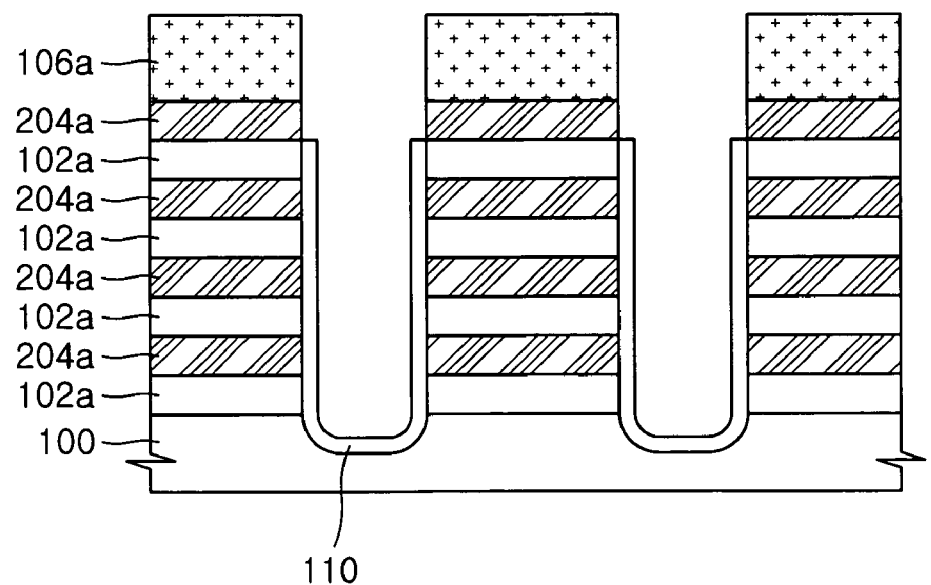

Referring to FIGS. 15A and 15B, an amorphous silicon layer is formed on the wall of the contact hole 108 and then crystallized using, for example, a solid phase epitaxial process to provide a single crystalline silicon layer 110. The solid phase epitaxial process may be performed by thermally treating (e.g., soft-baking) the amorphous silicon layer formed on the inside wall of the contact hole at a temperature of 600° C. for a relatively long time, e.g., about 12 hours to crystallize it.

Figure 16A:
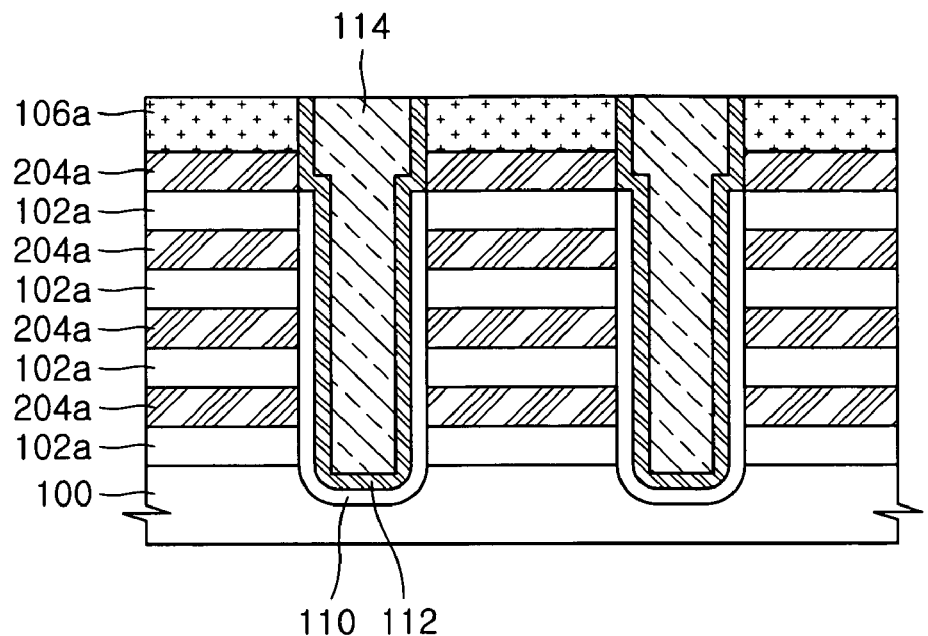
Figure 16B:
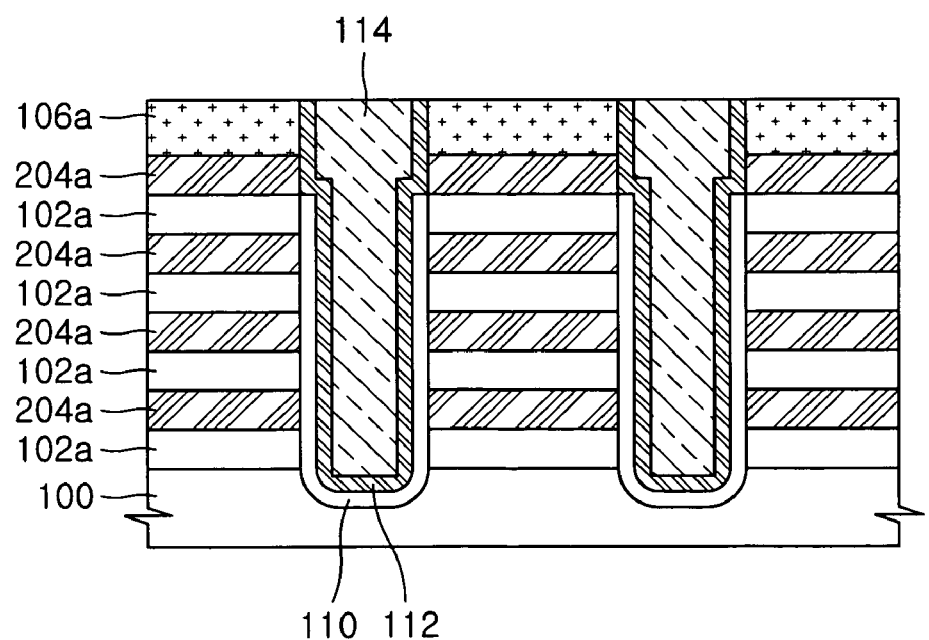
Figure 17A:
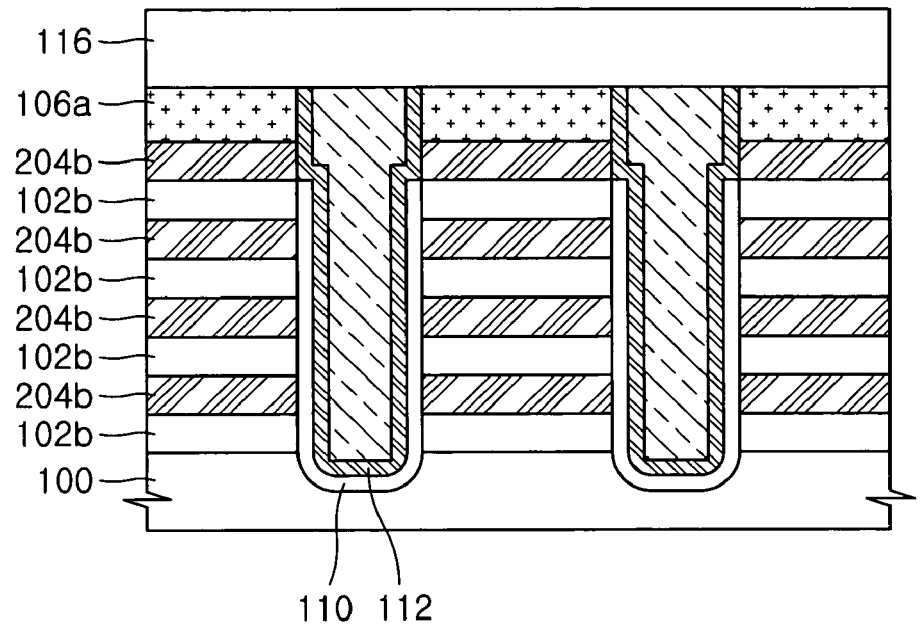
Figure 17B:
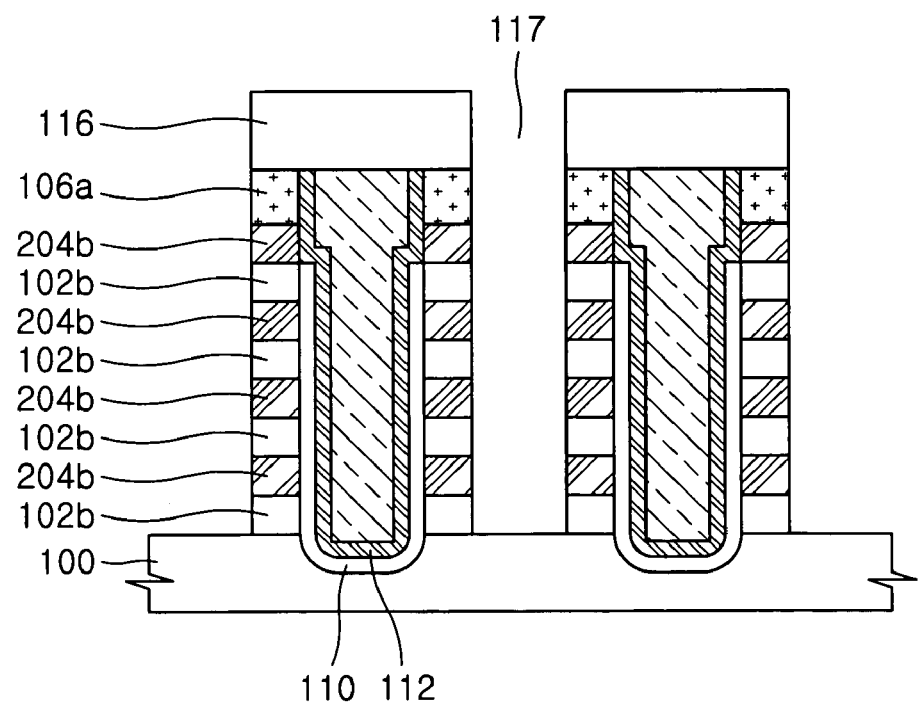

Referring to FIGS. 16A and 16B, a charge storing layer 112 is formed on the silicon layer 110 formed on the wall of the contact hole 108. As described above with reference to FIGS. 2 and 4, the charge storing layer 112 includes an oxide layer 112a, a nitride layer 112b, and another oxide layer 1112c.

Subsequently, a gate 114 is formed in the contact hole 108. The gate 114 is provided by forming a gate conductive layer (e.g., a metal layer) in the contact hole 108 and then planarizing the conductive layer.

Referring to FIGS. 17A, 17B, 18A and 18B, a second mask layer pattern 116 is formed on the first mask layer pattern 106a and the gate 114. The second mask layer pattern 116 may be provided by forming a mask material film (e.g., a silicon nitride film) on the first mask layer pattern 106a and the gate 114 and then patterning the mask material film using a photolithographic etching process.

Figure 18A:
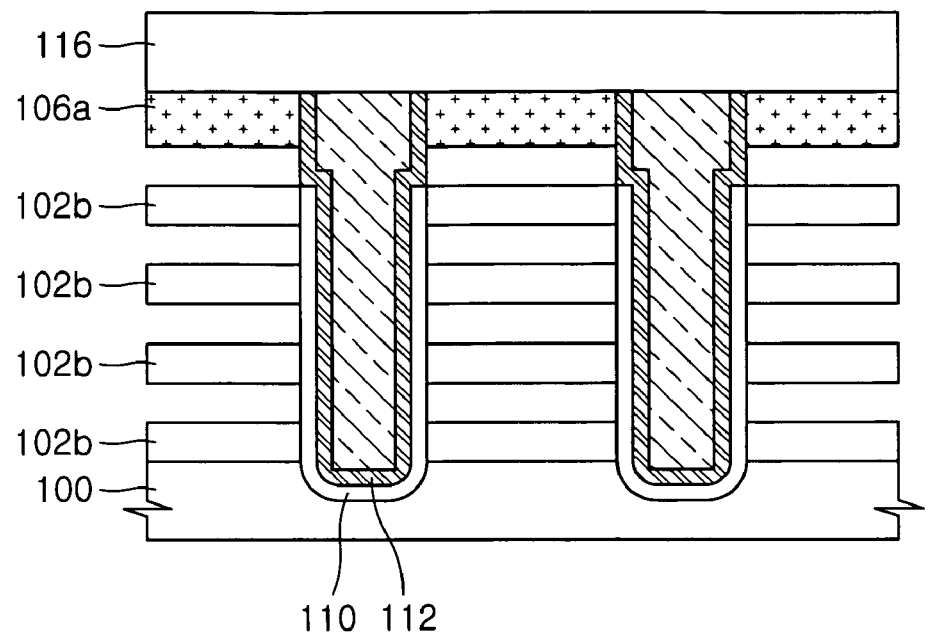
Figure 18B:
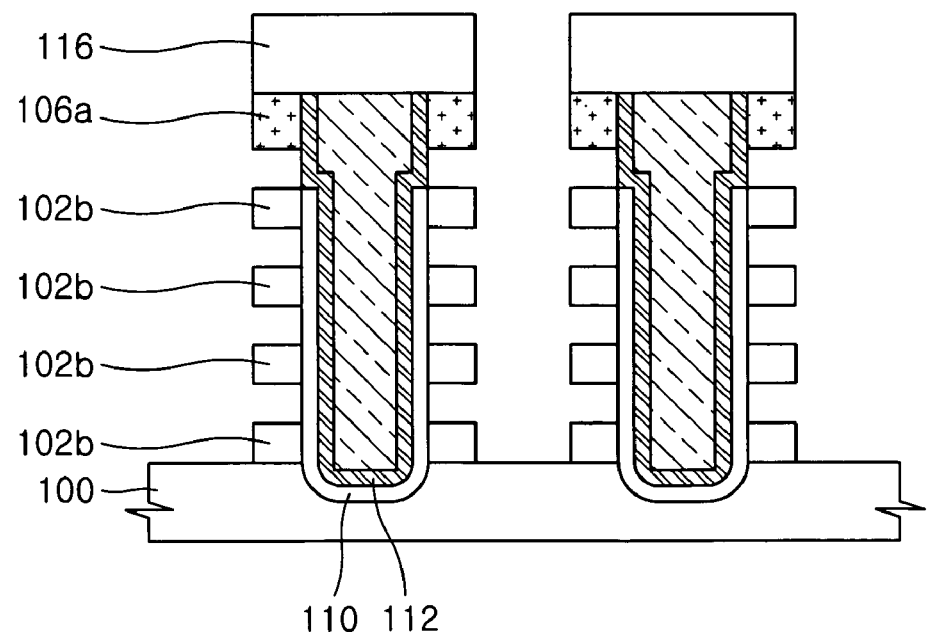

Subsequently, a trench 117 exposing the semiconductor substrate 100 is formed by etching the silicon-germanium layer pattern 204a and the silicon layer pattern 102a using the second mask layer pattern 116 as an etching mask. As a result, the silicon layer pattern 102 forms bit lines 102b. Then, the silicon-germanium layer pattern 204b is selectively removed as shown in FIGS. 18A and 18B.

Figure 19A:
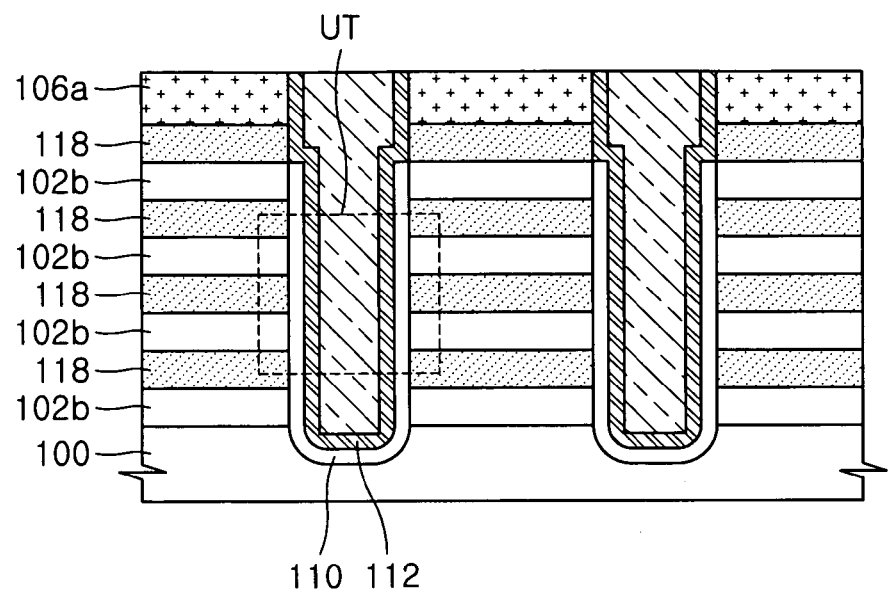
Figure 19B:
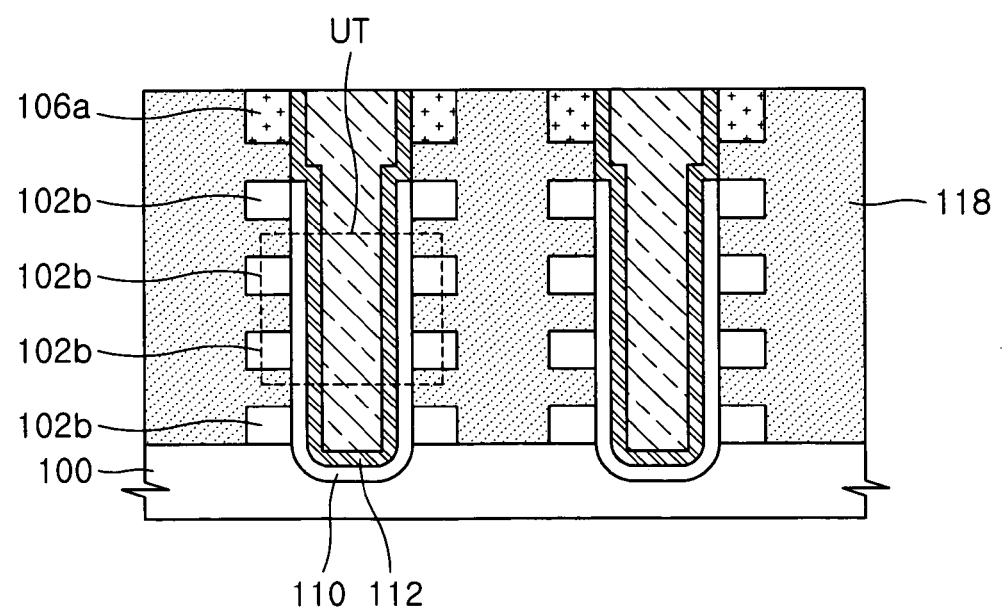

Referring to FIGS. 19A and 19B, a trench isolation layer such as a trench oxide layer 118 that buries the trench 117 is provided. In this case, the trench oxide layer 118 is also provided between the bit lines 102b. Subsequently, the second mask layer pattern 116b is etched to expose the gate 114 and then planarized. As a result, a unit transistor UT insulated by the trench oxide layer 118 is provided.

As described above, the source/drain regions 111 constituting the unit transistor UT may be provided by diffusing the impurities doped in the silicon layer 102 into the single crystalline silicon layer 112 in the thermal process (e.g., during the processes of forming the gate 114 or the second mask layer pattern 116) after forming the silicon layer 112.

Figure 20A:
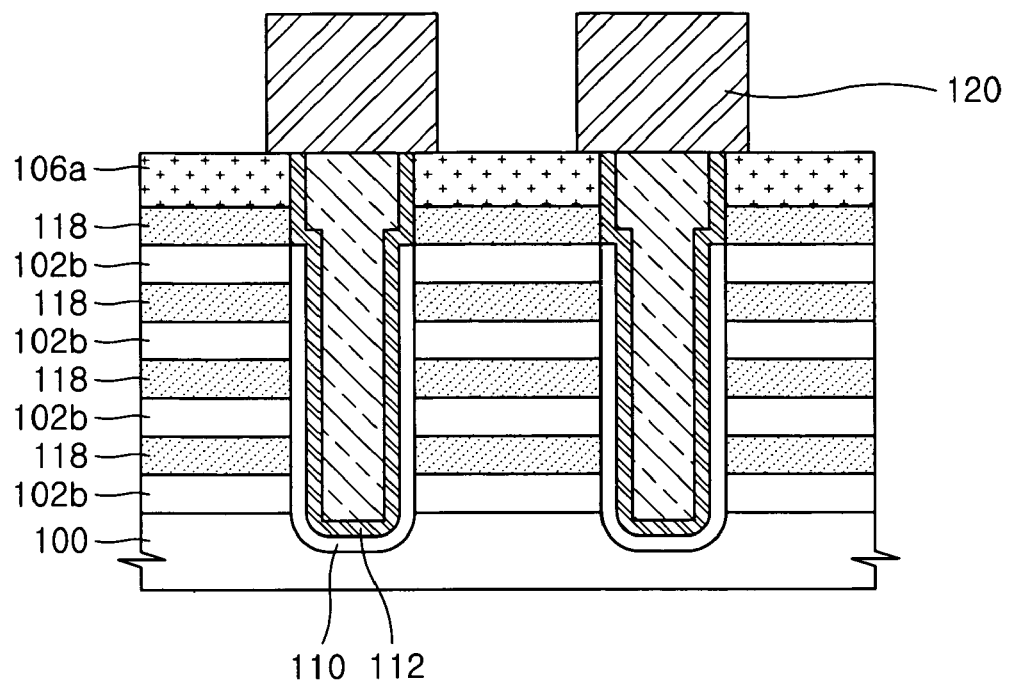
Figure 20B:
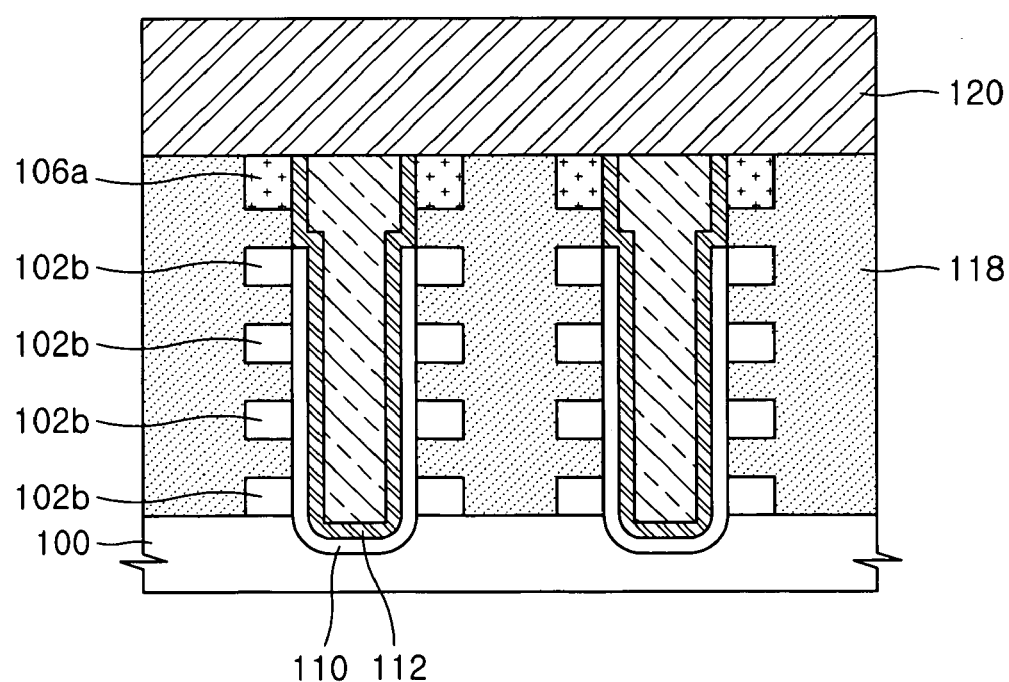

Referring to FIGS. 20A and 20B, a word line 120 connected to the gate 114 is provided by forming a conductive layer such as a metal layer on the gate 114 and patterning it, thereby completing the 3-D flash memory device.

In comparison with the flash memory devices illustrated in FIGS. 1 and 3, flash memory devices in the subsequent embodiments of the present invention are characterized in that a transistor having a source/drain region and a channel region may be provided on both sides of a gate to perform a 2-bit operation.

Figure 21:
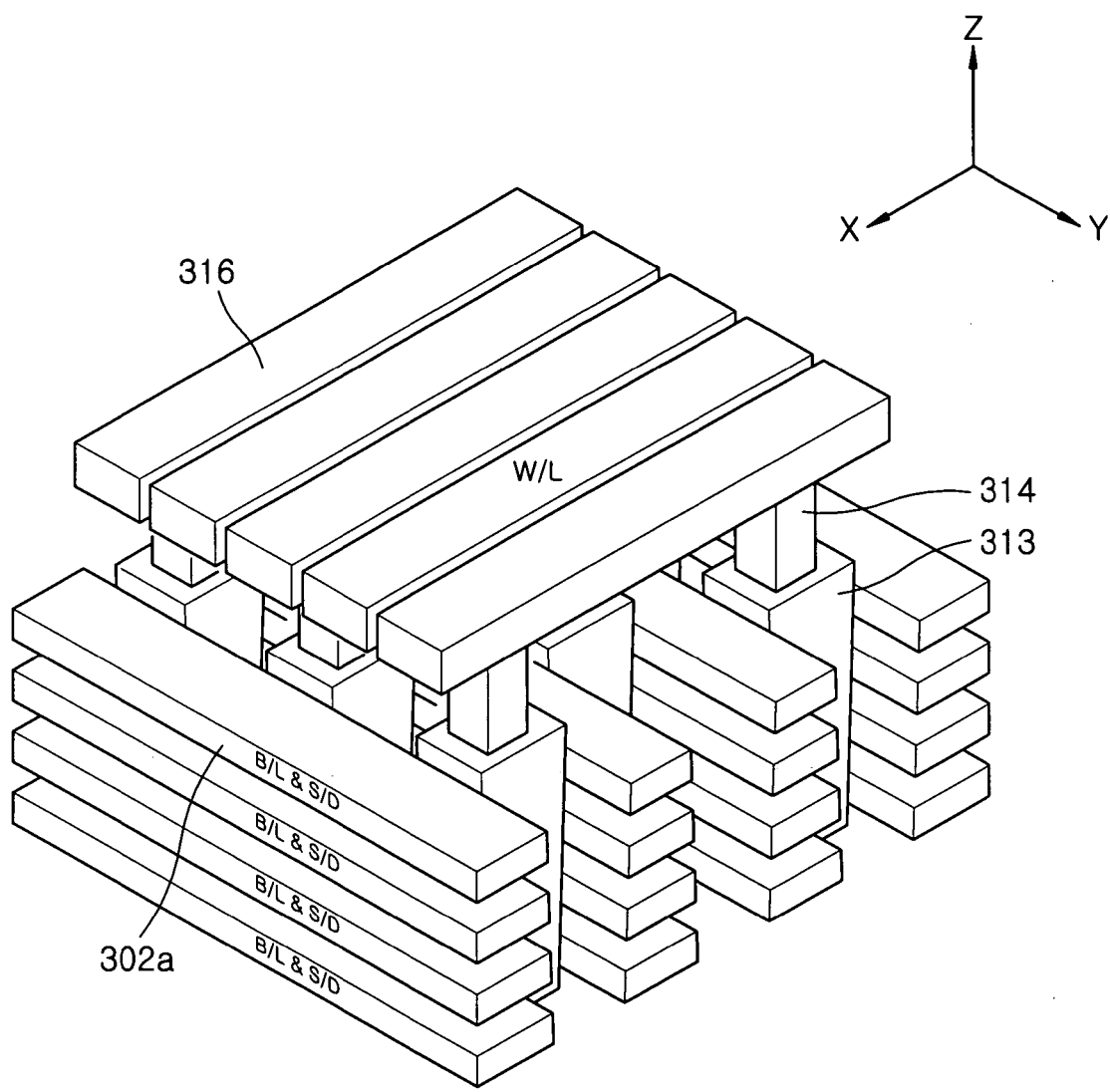
FIG. 21 is a perspective view illustrating a 3-D flash memory device according to an embodiment of the present invention.
Figure 22:
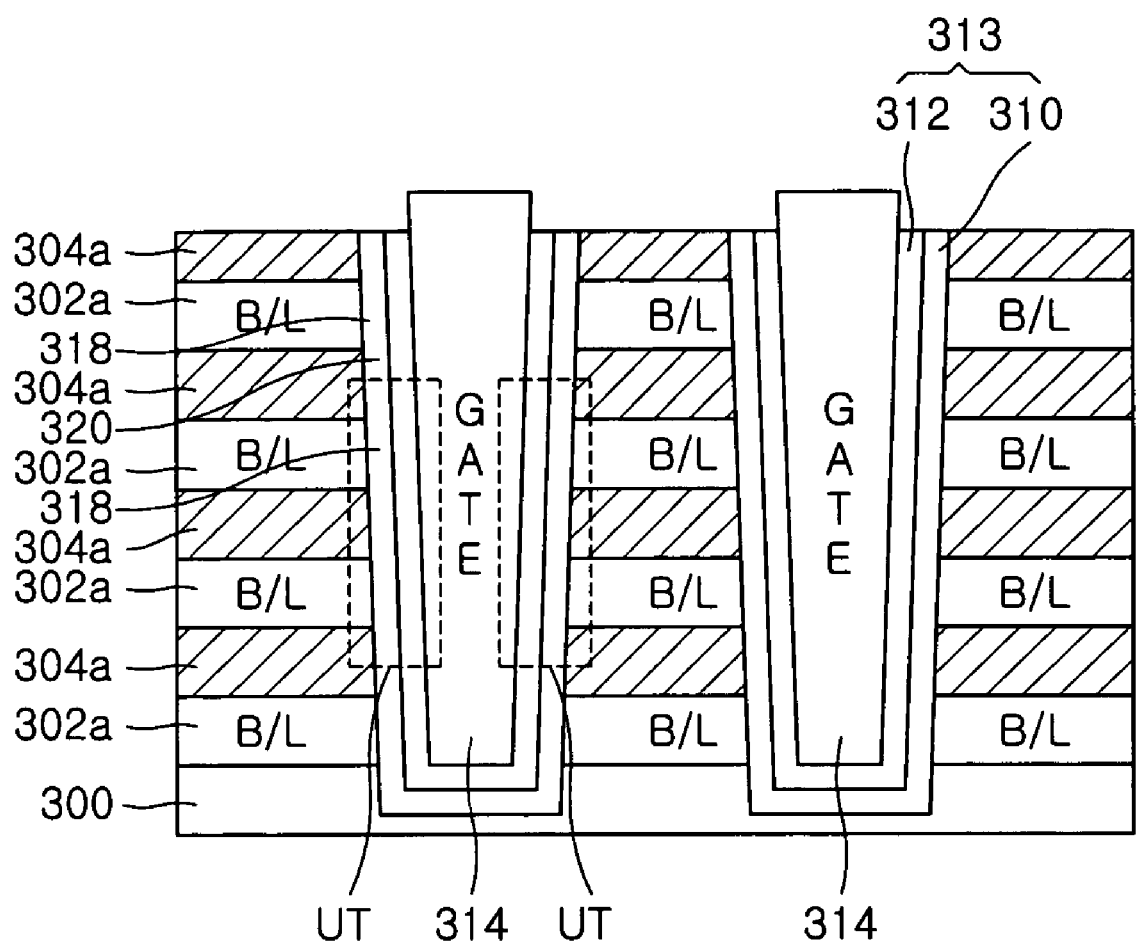
FIG. 22 is a cross-sectional view along a word line of FIG. 21.

FIG. 21 is a perspective view illustrating a 3-D flash memory device according to yet another embodiment of the present invention, and FIG. 22 is a cross-sectional view along a word line direction of FIG. 21.

Referring to FIG. 22, a gate 314 extending in a vertical direction (i.e., a z-direction) is formed on a semiconductor substrate 300. Similar to the flash memory devices shown in FIGS. 2 and 4, a charge storing layer 312 in a material layer 313 including a silicon layer 310 surround the gate 314. The structure of the charge storing layer 312 included in the material layer 313 is similar to that shown in FIG. 2. Therefore, it is omitted in FIG. 22 for convenience.

Channel regions 320 are symmetrically provided on both sides of the gate 314 in the silicon layers 310 of both sides of the gate 314. The channel regions 320 are isolated from one another along a vertical direction. Source/drain regions 318 may be symmetrically provided on both sides of the gate 314 in the silicon layers 310. The source/drain regions 318 are isolated from one another vertically by the channel regions 320 interposed therebetween.

Bit lines (B/L) 302a extending in a Y-direction are connected to the source/drain regions 318. The source/drain regions 318 may be formed by diffusing impurities included in the bit lines 302a into the silicon layer 310. As a result, the flash memory device according to the present embodiment is characterized in that a unit transistor UT is provided on both sides of each of the gates 314 extending vertically.

Referring to FIG. 21, a word line 316 extending in an x-direction is connected to the gate 314.

The 3-D flash memory device according to the present embodiment is a SONOS type memory device and can store data in a 3-dimensional manner to improve integration and perform a 2-bit operation by using the unit transistors UT formed on both sides of each gate 314. In the configuration shown in FIGS. 21 and 22, data can be stored in each of unit transistors UT and all data in the unit transistors UT connected to a single word line 316 can be deleted simultaneously.

Figure 23:
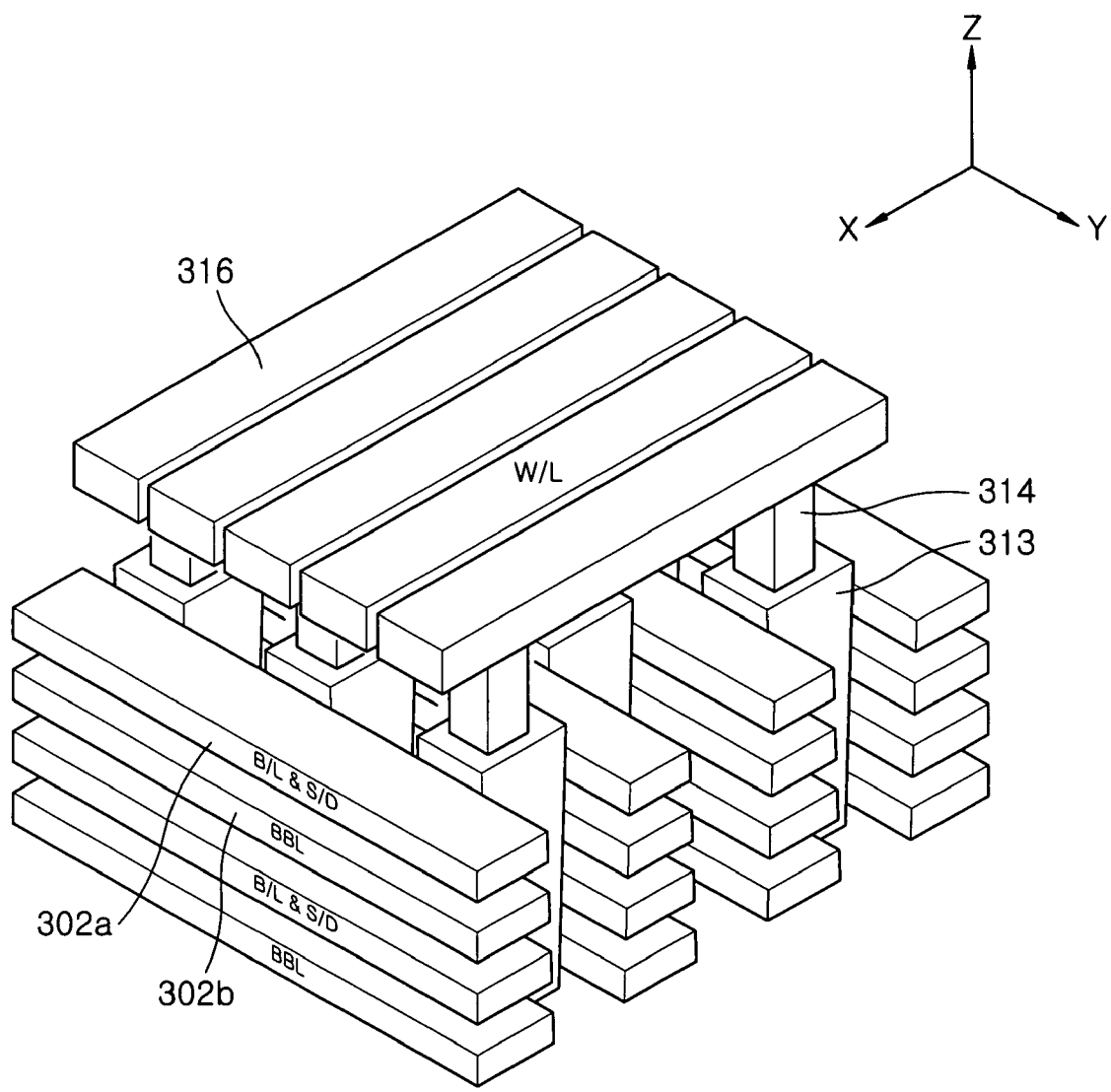
FIG. 23 is a perspective view illustrating a 3-D flash memory device according to an embodiment of the present invention.
Figure 24:
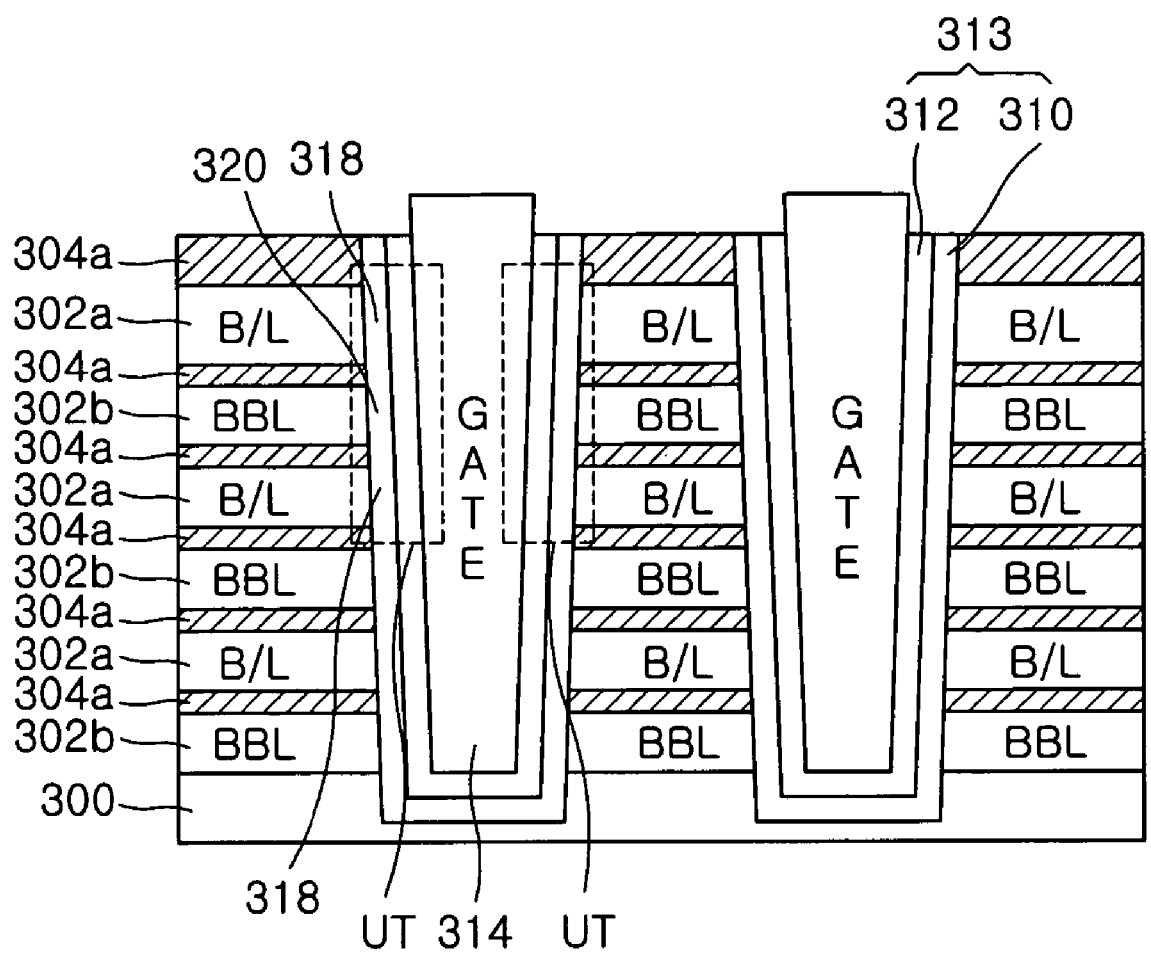
FIG. 24 is a cross-sectional view along a word line of FIG. 23.

FIG. 23 is a perspective view illustrating a 3-D flash memory device according to another embodiment of the present invention, and FIG. 24 is a cross-sectional view along a word line of FIG. 23.

In comparison with the flash memory device shown in FIGS. 21 and 22, the flash memory device shown in FIGS. 23 and 24 further includes a back bias line 302b connected to the channel region 320 extending in the Y-direction.

The 3-D flash memory device according to the present embodiment may be a SONOS type memory device and can store data in a 3-dimensional manner to improve integration and perform a 2-bit operation using unit transistors UT formed on both sides of the gate 314. Particularly, in the structure shown in FIGS. 23 and 24, data can be stored and deleted in each unit transistor because a back bias voltage can be applied to each of the unit transistors UT.

FIGS. 25 through 32 are cross-sectional views along a word line illustrating a method of fabricating a 3-D flash memory device according yet another embodiment of the present invention.

Figure 25:
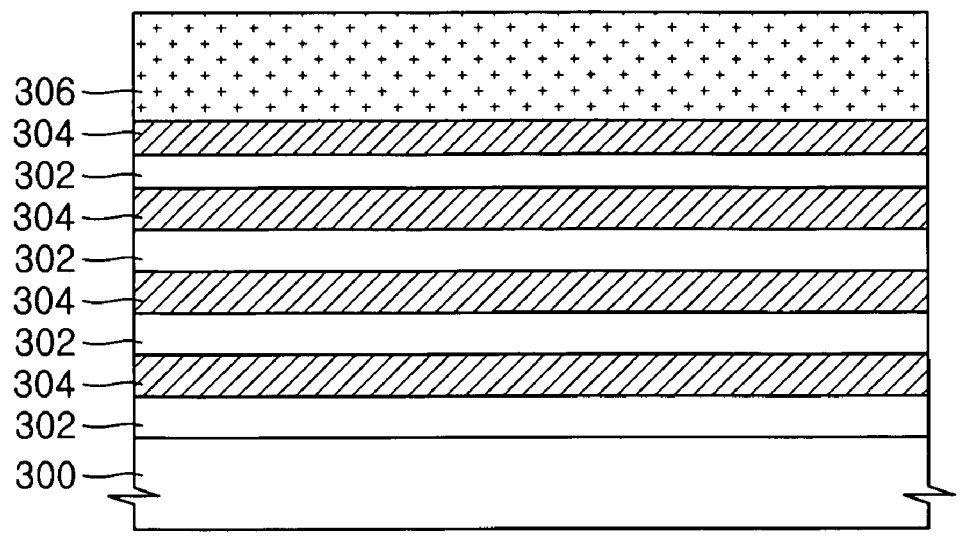
FIGS. 25 through 32 are cross-sectional views along a word line illustrating a method of fabricating the 3-D flash memory device shown in FIG. 21 or 23.

Referring to FIG. 25, a plurality of silicon layers 302 doped with impurities and oxide layers 304 are alternately formed on a semiconductor substrate 300. The silicon layers 302 may be crystallized. The silicon layers 302 and the oxide layers 304 on the semiconductor substrate 300 may be provided by using an SOI substrate prepared as shown in FIG. 25 instead of using redundant doping procedures. When fabricating a 3-D flash memory device shown in FIGS. 23 and 24, impurities are not doped in the silicon layer 302, which functions as a back bias line.

A first mask layer 306 is formed on the oxide layer 304. The first mask layer 306 may be a silicon nitride (SiN) layer.

Figure 26:
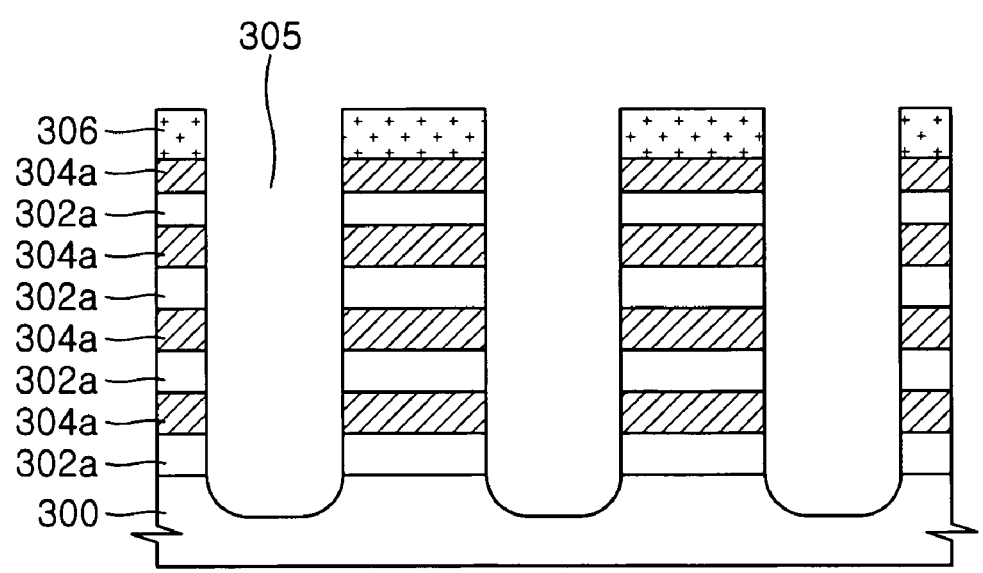

Referring to FIG. 26, a first mask layer pattern 306a is formed by patterning the first mask layer 306. Subsequently, the oxide layers 304 and the silicon layers 302 having doped impurities are sequentially etched using the first mask layer pattern 306a as an etching mask. As a result, oxide layer patterns 304a and silicon layer patterns 302a with a trench 305 exposing the semiconductor substrate 300 are provided. The silicon layer patterns 302a form bit lines.

Figure 27:
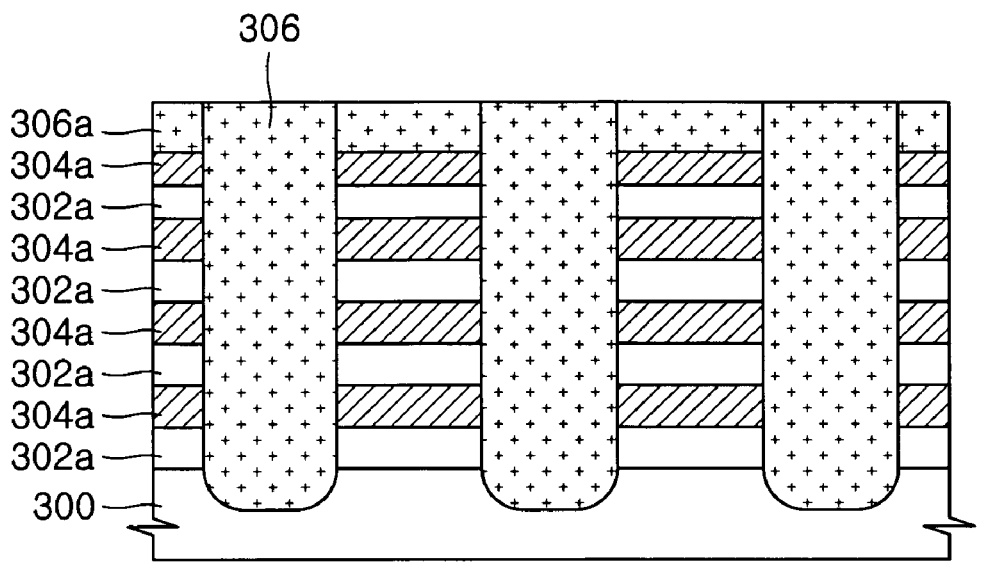
Figure 28:
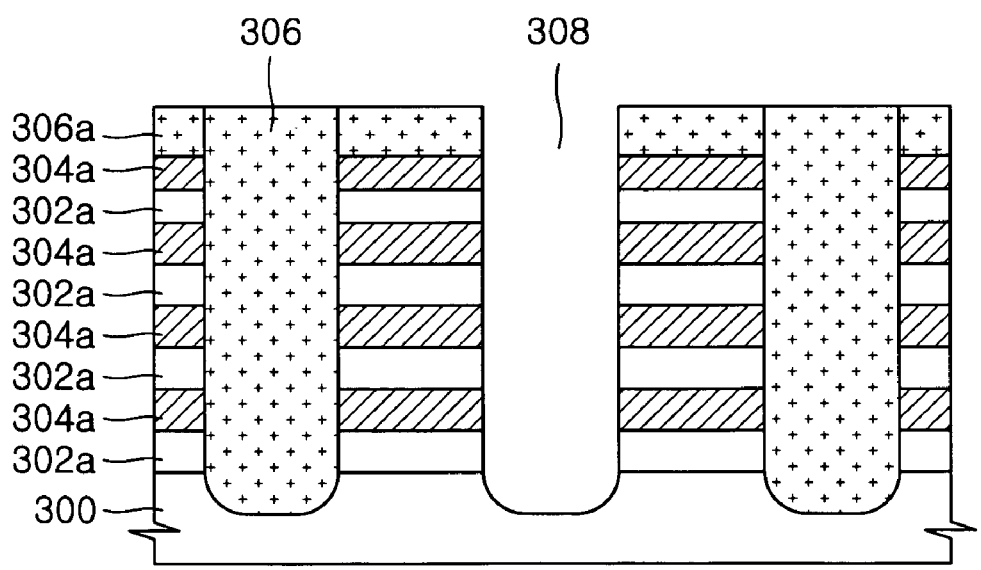

Referring to FIGS. 27 and 28, a trench oxide layer 306 burying the trench 305 is formed and planarized. Subsequently, the trench oxide layer 306 is selectively etched to produce a contact hole 308 exposing the semiconductor substrate 300.

Figure 29:
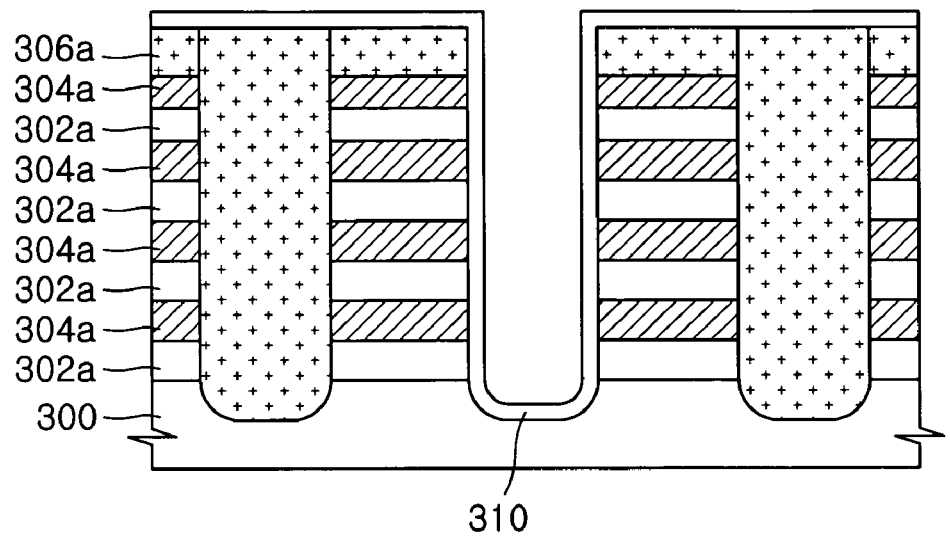

Referring to FIG. 29, an amorphous silicon layer is formed on the wall of the contact hole 308, and then, a single crystalline silicon layer 310 is formed by performing a solid phase epitaxial process. The solid phase epitaxial process is performed by thermally treating the amorphous silicon layer formed on the wall of the contact hole 308 at a temperature of 600° C. for a relatively long time, e.g., about 12 hours.

Figure 30:
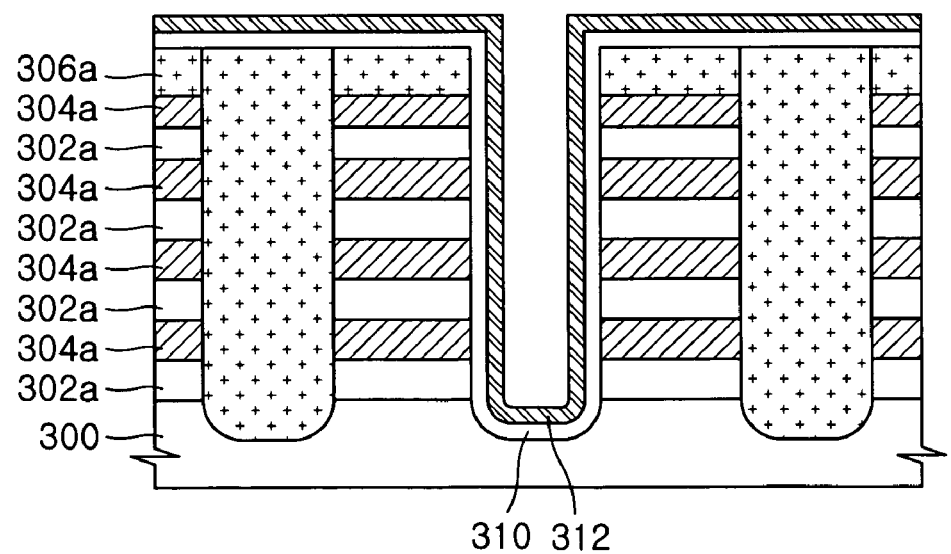

Referring to FIG. 30, a charge storing layer 312 is formed on the silicon layer 310 formed on the wall of the contact hole 308. As described above, the charge storing layer 312 includes an oxide layer, a nitride layer, and another oxide layer.

Figure 31:
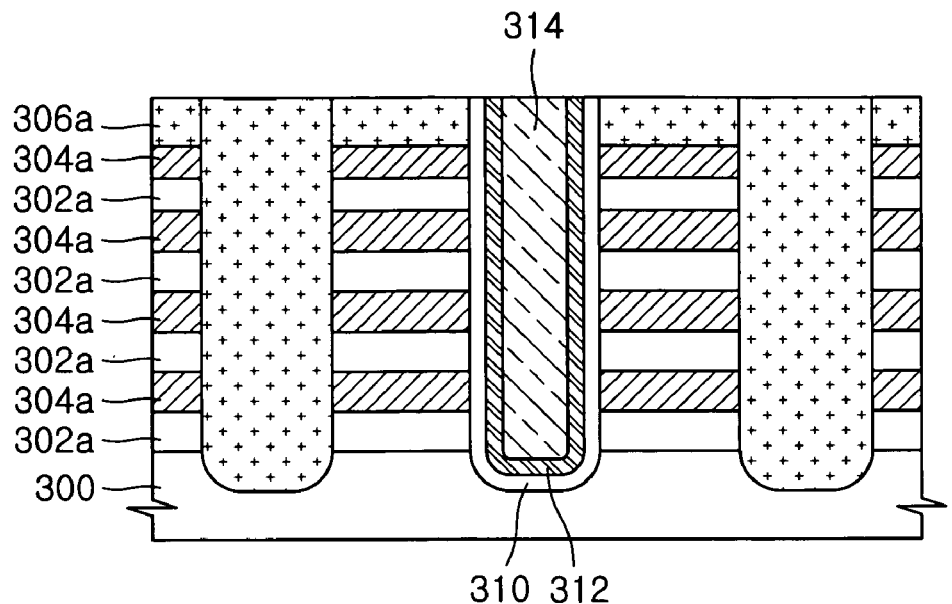

Referring to FIG. 31, a gate 314 is filled into the contact hole 308. The gate 314 may be provided by forming a conductive layer (e.g., a metallic film) in the contact hole 308 and planarizing the conductive layer, thereby forming the unit transistor UT. As described above, the unit transistor UT has source/drain regions isolated from each other vertically and a channel region interposed between the source/drain regions. The source/drain regions are formed in the silicon layers 310 on both sides of the gate 314.

The source/drain regions constituting the unit transistor UT may be formed by diffusing the impurities doped in the silicon layer 302 into the single crystalline silicon layer 310 during the thermal process (e.g., the process for forming the charge storing layer or the gate 314) after forming the silicon layer 310.

Figure 32:
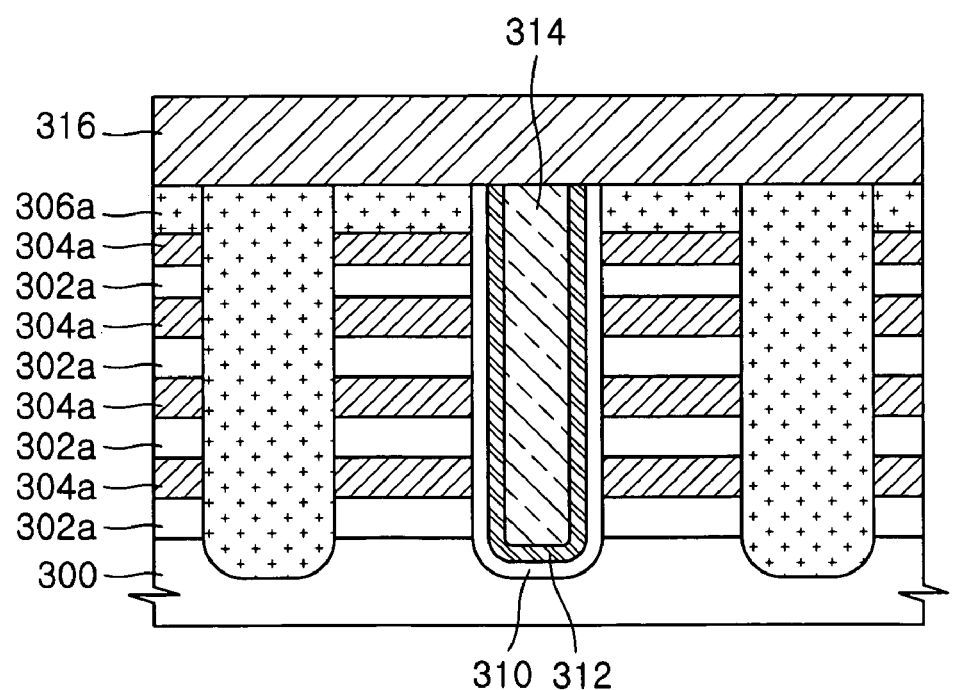

Referring to FIG. 32, a word line 316 connected to the gate 314 is provided by forming a metallic film on the gate 314 and then patterning the metallic film, thereby completing a 3-D flash memory device.

The 3-D flash memory device according to this embodiment can store data in a 3-dimensional manner to improve integration, and data can be stored and deleted in all transistors connected to a word line or in each transistor individually.

Furthermore, a 3-D flash memory device according to the present invention has transistors on both sides of the gate, and thus, can perform a 2-bit operation to improve integration.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
    a gate extending above a semiconductor substrate along a first direction, wherein the gate includes a sidewall extending along the first direction;
    a charge storing layer surrounding the gate;
    a silicon layer surrounding the charge storing layer;
    a channel region formed in the silicon layer;
    source/drain regions formed on both sides of the channel region in the silicon layer along the first direction; and
    bit lines connected to the source/drain regions, wherein at least one of the source/drain regions is disposed between at least one of the bit lines and the sidewall of the gate along a second direction perpendicular to the first direction.

2. The device according to claim 1, further comprising a word line connected to the gate.

3. The device according to claim 1, wherein the charge storing layer sequentially includes a first oxide layer, a nitride layer, and a second oxide layer.

4. The device according to claim 1, further comprising a back bias line connected to the channel region.

5. The device according to claim 1, wherein the channel region is formed in portions of the silicon layer outside the source/drain regions.

6. The device according to claim 1, wherein the first direction is a substantially vertical direction or a vertical direction relative to a surface of the semiconductor substrate.

7. The device according to claim 6, wherein the channel region is located between the source/drain regions along the first direction.

8. A 3-dimensional flash memory device comprising:
    a gate extending above a semiconductor substrate along a first direction, wherein the first direction is a substantially vertical direction or a vertical direction relative to a surface of the semiconductor substrate;
    a charge storing layer surrounding the gate;
    a semiconductor layer surrounding the charge storing layer;
    channel regions symmetrically disposed on opposite sides of the gate in the semiconductor layer and isolated from one another along the first direction; and
    source/drain regions symmetrically disposed on opposite sides of the gate in the semiconductor layer and spaced apart from one another along the first direction-by the channel regions.

9. The 3-dimensional flash memory device according to claim 8, further comprising a word line connected to the gate.

10. The 3-dimensional flash memory device according to claim 8, wherein the charge storing layer sequentially includes a first oxide layer, a nitride layer, and a second oxide layer.

11. The 3-dimensional flash memory device according to claim 8, further comprising bit lines that extend perpendicular to the gate and that connect to the source/drain regions.

12. The 3-dimensional flash memory device according to claim 11, wherein
    the gate includes a sidewall extending along the first direction, and
    at least one of the source/drain regions is disposed between at least one of the bit lines and the sidewall of the gate along a second direction perpendicular to the first direction.

13. The 3-dimensional flash memory device according to claim 8, further comprising back bias lines connected to the channel regions.

14. The 3-dimensional flash memory device according to claim 8, wherein the semiconductor layer is a single crystalline silicon layer.

15. The 3-dimensional flash memory device according to claim 8, wherein the channel regions are interposed between the source/drain regions along the first direction.

16. The 3-dimensional flash memory device according to claim 8, wherein the source/drain regions are spaced apart so as to be isolated from one another along the first direction.

17. A semiconductor device comprising:
a cylindrical gate that extends from a semiconductor substrate along a first direction, wherein the first direction is a substantially vertical direction or a vertical direction relative to a surface of the semiconductor substrate;
a charge storing layer concentrically surrounding the cylindrical gate;
a semiconductor layer concentrically surrounding the charge storing layer;
channel regions disposed in the semiconductor layer; and
source/drain regions disposed in the semiconductor layer and spaced apart from one another along the first direction by the channel regions, wherein the source/drain regions are spaced apart so as to be isolated from one another along the first direction.

18. The semiconductor device according to claim 17, wherein the channel regions are interposed between the source/drain regions along the first direction.

* * * * *

UNITED STATES PATENT AND TRADEMARK OFFICE
CERTIFICATE OF CORRECTION

| | |
|---|---|
| PATENT NO. | : 7,382,018 B2 |
| APPLICATION NO. | : 11/349287 |
| DATED | : June 3, 2008 |
| INVENTOR(S) | : Sung-Min Kim et al. |

Page 1 of 1

It is certified that error appears in the above-identified patent and that said Letters Patent is hereby corrected as shown below:

Column 5, line 15, the word "1112c" should read -- 112c --.

Signed and Sealed this

Nineteenth Day of August, 2008

JON W. DUDAS
*Director of the United States Patent and Trademark Office*